United States Patent [19]

Polichette et al.

[11] 3,930,963

[45] *Jan. 6, 1976

[54] METHOD FOR THE PRODUCTION OF RADIANT ENERGY IMAGED PRINTED CIRCUIT BOARDS

[75] Inventors: Joseph Polichette, South Farmingdale; Edward J. Leech, Oyster Bay, both of N.Y.

[73] Assignee: Photocircuits Division of Kollmorgen Corporation, Glen Cove, N.Y.

[ * ] Notice: The portion of the term of this patent subsequent to Nov. 13, 1990, has been disclaimed.

[22] Filed: Feb. 11, 1972

[21] Appl. No.: 225,645

Related U.S. Application Data

[63] Continuation-in-part of Ser. No. 167,435, July 29, 1971, Pat. No. 3,772,078.

[52] U.S. Cl. ............... 204/15; 96/36.2; 204/20; 204/24; 204/30; 204/38 B; 204/38 S; 427/97; 427/98; 427/290; 427/292; 427/305; 427/306; 427/316
[51] Int. Cl.$^2$ ............................ H05K 3/18
[58] Field of Search...... 117/47 A, 130 E, 212, 933, 117/217, 213; 204/15, 20, 30, 38 B, 24, 38 S; 96/36.2, 35

[56] References Cited
UNITED STATES PATENTS

| | | | |
|---|---|---|---|
| 3,152,903 | 10/1964 | Shepard et al........................ 96/64 |
| 3,436,233 | 4/1969 | Jackson ............................. 117/130 |
| 3,562,005 | 2/1971 | De Angelo et al................. 117/130 |
| 3,615,732 | 10/1971 | Shipley et al. ..................... 117/130 |
| 3,627,558 | 12/1971 | Roger et al........................... 117/47 |
| 3,674,485 | 7/1972 | Jonker et al........................ 96/36.2 |
| 3,704,208 | 11/1972 | Russo................................... 117/47 |
| 3,772,056 | 11/1973 | Polichette et al.................. 96/36.2 |

*Primary Examiner*—Douglas J. Drummond
*Assistant Examiner*—J. Massie
*Attorney, Agent, or Firm*—Morgan, Finnegan, Pine, Foley & Lee

[57] ABSTRACT

Radiant energy imaged printed circuit boards are provided by treating an insulating base with a composition of a reducible metal salt and a radiant energy sensitive compound, exposing the treated base to radiant energy in selected areas to produce metallic nuclei in the form of a non-conducting real image of the desired circuit pattern, rinsing the exposed base to remove unexposed metal salts and exposing the real image to an electroless metal bath to build up conductor lines of electroless metal thereon. In an alternative procedure, conductor lines are built up by electroplating with the same or a different metal and, optionally, solder coating.

53 Claims, 10 Drawing Figures

METHOD FOR THE PRODUCTION OF RADIANT ENERGY IMAGED PRINTED CIRCUIT BOARDS

CROSS-REFERENCE TO RELATED APPLICATION

This application is a continuation-in-part of copending application Ser. No. 167,435, filed July 29, 1971 now U.S. Pat. No. 3,772,078.

This invention relates to making printed circuits; and more particularly to improvements in providing the conductive pathways on and through insulating bases supporting such circuits.

It is a primary object of the present invention to provide improved methods for defining the conducting pathways in printed circuit boards.

It is a further object to provide radiant energy imaged pathways, which will eliminate the need for resist printing and etching or stripping operations.

Still another object is to provide a printed circuit board in which the conductor lines have high resolution, the resolution being limited only by the natural overhang of the metal plating.

A further object of this invention is to provide improved printed circuits having conductor patterns on both sides of an insulating base and with connecting conductive pathways through the base.

BACKGROUND OF THE INVENTION

The steps of making printed circuits from metal clad insulating bases by the so-called print and etch technique are well-known and are described, for example, in U.S. Pat. No. 3,269,861. Such methods are laborious and expensive in that they call for providing a relatively costly metal foil on a substrate, printing the foil with an acid-resistant mask to define a pattern, etching the exposed metal with an acid to remove it from the surface and finally stripping the resist to expose a conductive pattern of metal foil. In addition to being expensive and time-consuming to produce, printed circuits made by such processes have conductor patterns which are not strongly bonded to the base — the limiting factor being the efficiency of the adhesive used to bond the foil to the substrate — and this has been subjected to etching and stripping solutions.

In such print and etch techniques, the circuit diagram can be formed on the base panel in a variety of ways. In a photographic modification of the print-and-etch technique, a light sensitive enamel, such as a proprietary photoresist, is uniformly spread over the clean metal foil and dried. Then a pattern negative is placed over the coated panel and, and after exposure to a suitable source of light, the exposed areas of enamel are hardened. Immersion of the panel in a solvent for the non-hardened areas dissolves the unexposed enamel away from the base leaving the metal foil showing. The portions of foil not protected by the hardened enamel are etched. Following etching, the exposed, hardened light sensitive enamel is stripped from the panel with an appropriate solvent to produce the printed circuit board.

In addition to the other disadvantages in the print and etch techniques, as noted above, such a photographic system is slow and expensive in long production runs and therefore resist printing is conventionally carried out instead either by offset printing or by screen stencil printing, both of which provide limitations on line thinness, and resolution.

A method has now been discovered to radiant energy from the patterns which eliminates the need for resists and etching, thereby eliminating the onerous stripping steps heretofore employed. In addition, the pattern produced is capable of being intensified into a conductive pathway by conventional metallization techniques, and thus there is no need to attach a foil to the base and etch away the uneeded areas to define the patterns. The most recently evolved techniques of unclad resin bonding and for direct (adhesiveless) bonding are applicable with the new technique, and bond strengths between the conductor lines and all conventional nonpolar substrates are superior to what are obtained from conventional adhesive backed foil clad substrates. Moreover, by providing holes in the substrate, in strategic locations, and irradiating the hole walls as part of producing the printed circuits, through-hole electrical connections may be made non-mechanically, between circuit patterns on opposite sides of the insulating base. Finally, because the negatives can have very thin lines, the conductor lines can be very thin too, and the resulting circuit patterns can be highly resolved with line thinness limited only by overhang of the metal deposit.

DESCRIPTION OF THE DRAWINGS

Other objects of the invention will become apparent after a reading of the following specification and an inspection of the accompanying drawings, wherein.

DESCRIPTION OF THE INVENTION

Figure 1:
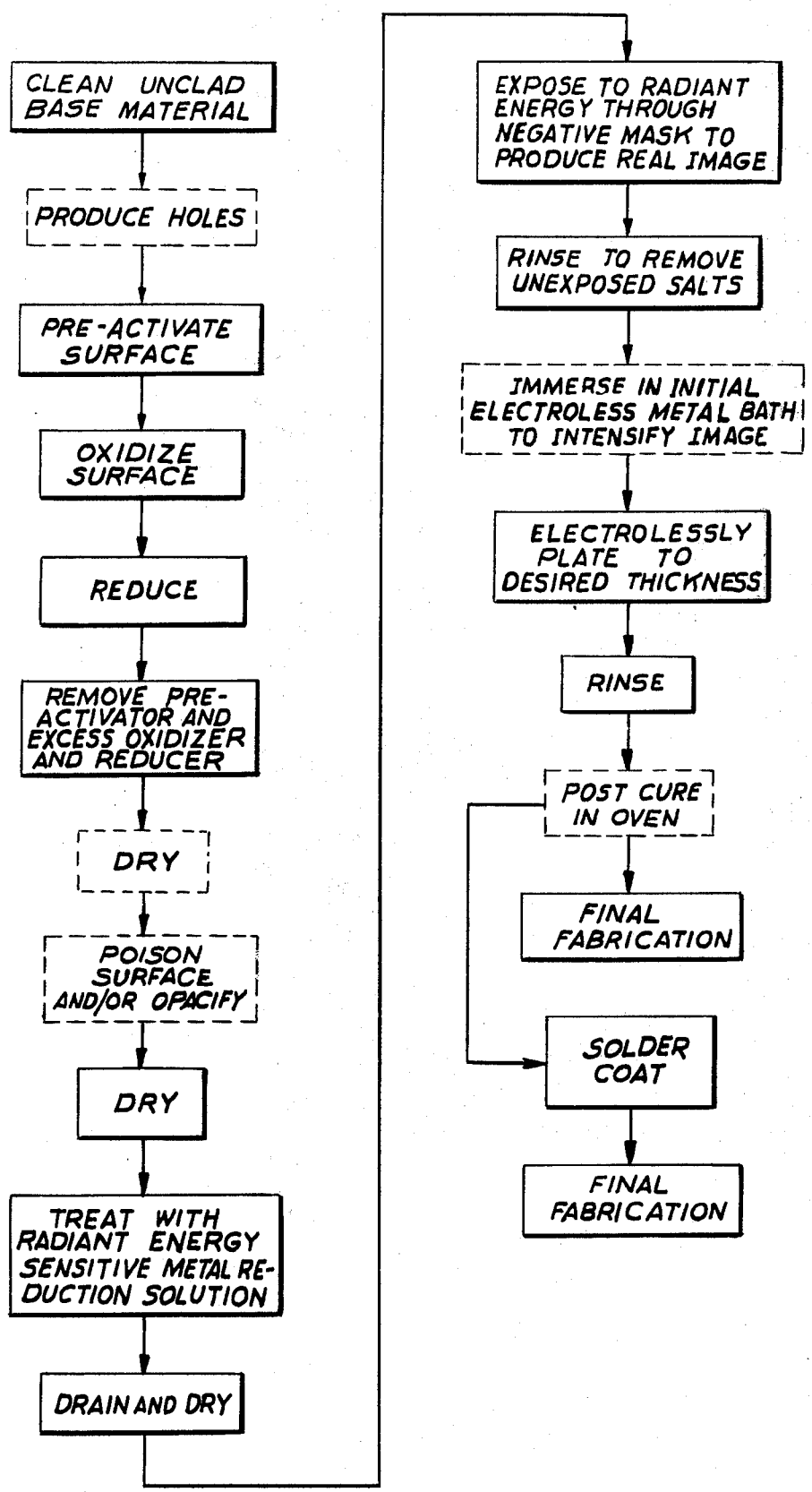
FIG. 1 is a flow diagram showing the steps in making printed circuits according to various embodiments of the present invention using a direct bonding (adhesiveless) technique with a nonpolar base material. Broken lines around the boxes indicate optional steps.

According to the present invention, printed circuit boards are provided by treating an insulating base with a composition of a reducible metal salt and a radiant energy sensitive compound, exposing the treated base to radiant energy in selected areas to produce metallic nuclei in the form of a non-conducting real image of the desired circuit pattern, rinsing the exposed base to remove unexposed metal salts, and exposing the real image to an electroless metal bath to build up conductor lines of electroless metal thereon.

The form of radiant energy used to develop the image is not critical to the invention. For example, in the invention's broad aspects and depending on the nature of the solution, heat, light, particles and charges may be used to provide the necessary radiant energy. Preferably, the radiant energy will comprise light, both visible or invisible, X-ray radiation, electron beams or the like. Conveniently, the radiant energy will comprise actinic light, such as that from a carbon arc, or ultraviolet light, such as is generated by a mercury vapor lamp, although ordinary incandescent lamps, and even sunlight can provide these preferred forms of radiant energy. Infrared light can also be used.

In preferred embodiments, the insulating base will be opaque to the transmission of radiant energy therethrough.

The process can be carried out by intensifying the real image into the conductor patterns in one or more electroless metal baths. However, it is a preferred embodiment to intensify the image by exposing the base having the non-conductive nuclei to an initial electroless metal bath, e.g., a bath specially formulated to provide a rapid, thin conductive plating. This plating then can serve as a base for subsequent electroless plating, electroplating or the like, to the desired conductor thickness. Suitable initial electroless baths will be described hereinafter.

In general, any base material conveniently used for the production of printed circuits can be used in the present process. It will, of course, not be metal clad on the surface beneath the area on which the circuit is to be employed. The insulating base material will be selected from inorganic substances, such as resins, optionally filled or containing glass, ceramic, porcelain, paper, cloth and similar conventional components. For panels, it is preferred to use unclad laminated resinous structures, molded resins and the like.

Specifically, among the materials which may be used as bases in this invention are unclad insulating thermosetting or crosslinkable resins, thermoplastic resins and mixtures of the foregoing, including those reinforced with fiber and woven reinforcements, such as fiberglass filaments and mats, cloth, paper and similar materials.

Illustrative thermoplastic resins include acetal resins, acrylics, such as methyl acrylate, cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile-styrene copolymers and acrylonitrile-butadiene-styrene copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidenechloride and vinyl formal.

Among the thermosetting and cross-linkable may be mentioned allyl phthalate, furane, melamine formaldehyde; phenolformaldehyde and pehnolfurfural copolymers, alone or compounded with butadiene-acrylonitrile copolymers or acrylonitrile-butadiene-styrene copolymers; polyacrylic esters; silicones; urea-formaldehydes; epoxy resins; allyl resins; glyceryl phthalates; polyesters; and the like. Also suitable are inorganic substrates, such as ceramic, glass, porcelain, steatite and the like.

The present invention is applicable in its preferred embodiments to such base materials in which the surfaces are non-polar and difficult to "wet", e.g., with water. The invention is particularly applicable to the production of printed circuits from base materials comprising resin impregnated fibrous structures and resin varnish coated such structures. Particularly useful as base materials are epoxy resin impregnated fiber laminated structures or resin laminated, epoxy varnish coated structures.

Preferred substrates for this invention are opaque to the transmission of radiant energy. This prevents "printing-through" and also facilitates simultaneous or sequential formation of images and circuits on both major surfaces of the board. The bases can be rendered opaque to light energy mechanically, i.e., by frosting with sandblasting and the like, or chemically by etching with appropriate reagents, such as chromic acid for resins and hydrogen fluoride for glass, alkali for procelain, and the like. Frosted surfaces will scatter rather than absorb incident energy. On the other hand, energy absorbing substances can be dispersed in the base or adsorbed on the surface thereof to render the base opaque. By way of illustration, pigments, such as carbon black and titanium dioxide are useful to prevent penetration by light in the visible wavelengths, see, e.g., U.S. Pat. No. 2,888,954; bismuth, tin, lead and thorium compounds, as well as organic iodine compounds are useful as X-ray radiation and electron beam barriers, see, U.K. Pat. No. 686,445; U.K. Pat. No. 517,382; U.S. Pat. No. 3,361,700; U.S. Pat. No. 3,336,918; U.S. Pat. No. 2,857,915 and U.S. Pat. No. 2,403,704. Lead compounds are useful neutron shields. In preferred embodiments, the base will be rendered opaque to light energy, particularly at visible or ultraviolet wavelengths with a conventional compound, such as a hydroxybenzophenone, a hydroxybenzotriazole or a substituted acrylate, and the like; see, for example, U.S. Pat. No. 155,616, filed June 22, 1971, the disclosure of which is incorporated herein by reference.

The composition used to treat the base material in accordance with this invention will comprise a reducible metal salt and a radiant energy sensitive compound. In general, the composition will be a solution in which the solvent can comprise any volatile liquid capable of dissolving the components but not otherwise capable of attacking the surface of the substrate to a substantial degree. Among the solvent components which have been found to be convenient can be mentioned: water, polar organic substances, such as alcohols, e.g., methanol, dialkyl acid amides, e.g., dimethyl formamide, diethyl formamide, dimethyl acetamide, dialkyl sulfoxides, e.g., dimethyl cellosolve, N-methyl-2-pyrrolidone, dioxane, and the like, including mixtures of any of the foregoing. The reducible metal salt can comprise, in general, a cation selected from the metals of Groups VIII and IB of the Periodic Table of Elements. The anion associated in such metal salts can vary widely, and can comprise organic and inorganic anions such as halides, sulfates, nitrates, formates, gluconates, acetates, and the like. The cations in such salts will include gold, silver, iridium, platinum, palladium, rhodium, copper, nickel, cobalt and iron, in any of the usual degrees of oxidation, e.g., both cuprous and cupric, ferrous and ferric, etc., will serve. Preferred metal salts will be selected from Period 4 of Groups VIII and IB: iron, cobalt, nickel and copper salts. Especially preferred for the production of the real image comprising metallic nuclei in the present are copper salts.

The radiant energy sensitive compound used in association with the reducible metal has the property of decomposing to a compound which will exercise a reducing action on the exposed metal salt. Such radiant energy sensitive compounds form a family of scope well known to those skilled in the art. Among them may be mentioned ferric salts, dichromate compounds, anthraquinone and its compounds, amino acids, such as glycine, unsaturated organic compounds such as L-ascorbic acid, cinnamic acid, stilbenes, or azide compounds and the like. Because visible and ultraviolet light are the most convenient sources of radiant energy, the solutions used in this invention perferably contain such compounds which are sensitive to visible or ultraviolet light. Especially preferred are ferric salts, dichromates, and anthraquinone, and derivatives thereof. Illustrative among these are:

a. ferric salts, such as ferric ammonium citrate (green or brown), ferric potassium citrate, ferric ammonium oxalate, ferric sodium oxalte, ferric potassium oxalate, ferric ammonium tartrate, ferric citrate, ferric oxalate, ferric chloride, and the like;

b. bichromate salts, such as those of the general formula $Me_2Cro_3CrO_4$ wherein Me is any common metal cation, such as alkali metal, alkaline earth metal, ammonium or substituted ammonium, and the like, e.g., sodium bichromate, potassium bichromate, or mixtures therof with organic substances of animal or vegetable origin such as gelatin, fish glue, gum arabic, shellac, and the like, such as bichromated starch, and the like; and c. anthraquinone or derivatives thereof, such as 9,10-anthraquinone, $\beta$-chloroanthraquinone, $\beta$-phenylanthraquinone, 1,2-benzanthraquinone, anthraquinone-2-sulfonic acid, anthraquinone-2,6(or 2,7-)-disulfonic acid, salts thereof, and particularly anthraquinone 2,6-disodium sulfonate, anthraquinone-2,7-disodium sulfonate, anthraquinone-2,7-dipotassium sulfonate, and the like. Other useful radiant energy sensitive compounds will suggest themselves to those skilled in the art, and a wide variety of such compounds are shown, for example, in standard reference works, such as J. Kosar, Light-Sensitive Systems, Wiley, New York (1965), incorporated by reference.

A preferred ingredient in treating composition is a secondary reducer, such as an organic, oxygen- or nitrogen-containing compound. Such as ingredient serves to facilitate interaction of radiant energy and the radiant energy sensitive compound to provide reduction of the metal salt to the free metal nuclei. Although the secondary reducer compound may be any oxidizable organic compound which is soluble in the solution, does not attack the base material, and is inert to the other ingredients, it is preferred that it comprises a hydroxy compound such as an alcohol or a polyol. Especially preferred as secondary reducing compounds are alcohols or polyols. Among the organic oxygenated compounds can be mentioned, glycerol, ethylene glycol, pentaerythritol, mesoerythritol, 1,3-propanediol, sorbitol, mannitol, 1,2-butanediol, pinacol, sucrose, dextrin, polyethylene glycols, lactose, starch, gelatin, and the like. Especially preferred are glycerol, sorbitol and pentaerythritol.

Instead of the organic oxygenated compound the composition may also include other secondary reducers which serve the same function, including amino compounds, polyethers, certain dyestuffs and pigments. Among these may be mentioned aldehydes, such as formaldehyde, benzaldehyde, acetaldehyde, N-butyraldehyde, polyamides, such as nylon, albumin and gelatin, leuco bases of triphenylmethane dyes such as 4-dimethylaminotriphenylmethane; leuco bases of xanthene dyes such as 3,6-bisdimethylaminoxanthane and 3,6-bisdimethylamino-9-(2-carboxyethyl)xanthene; polyethers, such as ethylene glycol diethyl ether, tetraethylene glycol dimethylether, alizarin, erythiocin, phthalocyanine blue, zirconium silicate and the like.

It has been found that the addition of certain other ingredients of the composition provides unexpected advantages, and such modified solutions are preferred embodiments thereof. Addition of certain of these ingredients hereinafter called metal reduction intensifiers/accelerators/stabilizers, will speed up the exposure time to as little as 2 seconds to 2 minutes (depending on the substrate); some will help bring out the image and provide better contrast; some provide antifogging effects, other lead to better definition and many aid in preventing the image from fading. The advantages provided by these additives, especially, are important advances in the art. For example, image formation can be accelerated; contrast can be improved, the need for the heat intensification can be eliminated and the stability of the image enhanced if to the solution comprising the metal salt and radiant energy sensitive compound are added halogens, e.g., bromides and chlorides, alone or in combination with metals such as tin, alkali metals, mercury, germanium, titanium, molybdenum, rare earths, amines, ammonia and the like. Illustrative of such compounds, are: hydrogen halides and alkali metal or alkaline earth metal, ammonia or amine halides, and the like. Particularly preferred are stannous chloride, hydrogen chloride, hydrogen bromide, potassium chloride, and potassium bromide. In some embodiments the recited compounds may be used with organic acids, such as mono-, di-, tri-carboxylic acids or salts thereof and the like, for example, with acetic acid, citric acid, oxalic acid and the like.

In addition to the metal reduction image intensifiers/accelerators/stabilizers, the composition comprising the metal salt and the radiant energy sensitive compound can include also a surfactant, and this is preferably the base materials which are hard to wet with particular composition employed. The choice of the surfactant is not particularly critical, but usually it is preferred to use a non-ionic surfactant, because this permits a broader range in formulation. Among the suitable surfactants are polyethyleneoxy non-ionic ethers, such as Triton-X 100, manufactured by Rohm & Haas Co., and non-ionic surfactants based on the reaction between nonylphenol and glycidol such as surfactants 6G and 10G manufactured by the Olin Company (See, U.S. Pat. No. 3,514,293). Also suitable are fluorocarbon surfactants such as perfluorodecanoic acid and the series of related compounds manufactured by the 3M company under the product designation, FC-170, and the like.

The treating composition may be formulated within broad concentration ranges, depending primarily on the relative amount of metal salt composition desired to be placed on the base material, which in turn will depend on the mode of application, e.g., immersion, dip coating, roller coating, curtain coating, spraying and the like. In addition, the concentration of the ingredients in solutions will be limited by solubility in the component selected for the carrier or solvent. In general, the metal salt concentration will be pre-determined and the amounts of radiant energy sensitive compound and other ingredients, if present, will be adjusted to provide a ratio which will insure the desired result. This is well within the skill of those familiar with the art of formulating radiant energy sensitive systems. For example, at least enough radiant energy sensitive compound will be present to facilitate substantially complete reduction by exposure to radiant energy of the metal salt to the free metal nuclei. Usually to insure complete reduction, a substantial excess of the radiant energy sensitive compound (based on the reducible metal ions) will be present. The metal salt concentration in solutions can vary over wide limits, e.g., from 0.5 to 100 grams or more per liter can be used, but it is most convenient and economical not to use more than about 25 grams per liter and preferably less than about 15 grams per liter. The radiant energy sensitive compound can comprise from about 1 to 10 or more equivalents, based on the metal salt. The amount of the secondary reducer, e.g., glycerol, pentaerythritol, dyestuff or the like, can likewise vary over a wide range, e.g., from 0.5 to 500 g. per liter, but in the case of liquid, through difficultly volatile compounds, it is preferred not to include so much of such compounds that the treated surface is wet or sticky to the touch after drying. The ingredients, such as halide ions, stannous halides and carboxylic acids added to the compositions as image intensifiers, accelerators, stabilizers, etc., will generally be used in relatively low concentrations, e.g., from trance amounts, e.g., from about 1 mg. per liter up to about 2 grams per liter. Surfactants will be used in small, but conventional quantities, if present. The non-ionics will be used at levels from about 0.1 to 2 grams per liter; and anionics from about 0.1 to 1.0 grams per liter.

| A typical solution will comprise, for example: | |
|---|---|
| reducible metal salt | 0.5 – 50 grams |
| radiant energy sensitive compound (but at least stoichiometric with metal salt) | 1 – 50 grams |
| secondary reducer (glycerol, pentaerythritol, etc.) | 0 – 500 grams |
| image intensifier/accelerator/stabilizer (citric acid, stannous chloride, hydrobromic acid, etc.) | 0 – 2 grams |
| wetting agent (fluorinated hydrocarbon surfactant, polyethylene glycol, nonylphenyl-glycidol reaction product, etc.) | 0 – 2 grams |
| solvent (water, dimethylformamide, alcohol, dioxane, etc.) (to make) | 1000 millileters |

Preferred such solutions will be exemplified hereinafter. Others are also disclosed in copending parent appliction, Ser. No. 167.435, filed July 29, 1971.

Figure 2:
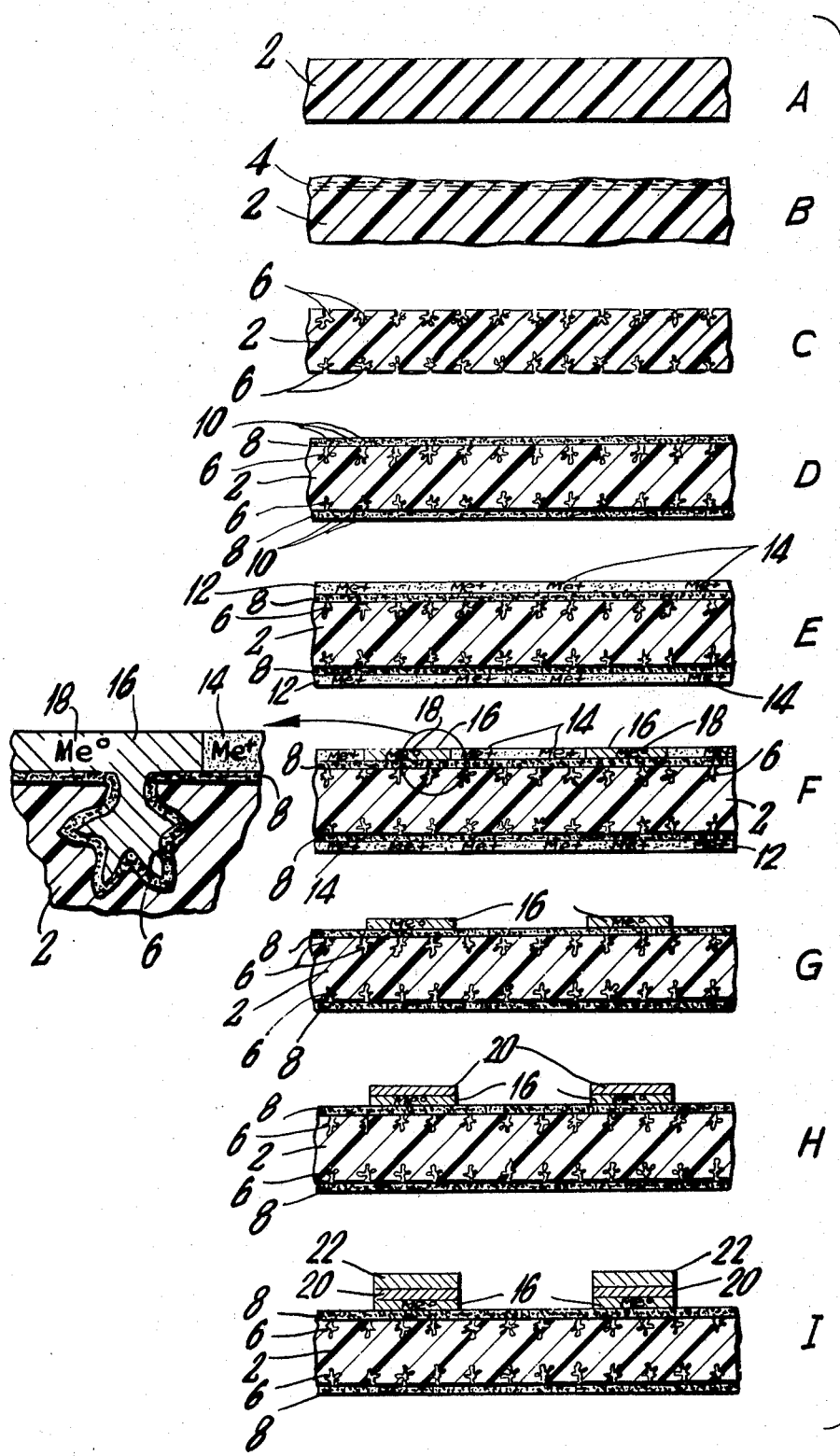
FIG. 2 is a schematic illustration showing the steps in making a one-sided printed circuit according to the method of FIG. 1.

The steps in making printed circuits from an unclad laminate by a direct bonding process combined with the radiant energy imaging technique according to this invention is shown in flow diagram form in FIG. 1 and schematically in FIG. 2.

At A in FIG. 2, there is shown an unclad laminate base material, e.g., of epoxy-glass construction, indicated generally by reference numeral 2.

At B, base material 2 is shown, in exaggerated form for better understanding, after having been preactivated, e.g., by immersion in a preactivating compound or composition, e.g., a liquid solvent or mixture, such as dimethyl formamide, dimethyl sulfoxide and the like. The sub-adjacent surface areas 4 are shown to have become somewhat roughened, partially softened and to have imbibed a small quantity of the liquid.

At C, the base material is shown after the surface has been treated with an oxidizing agent, e.g., with chromic acid, sulfuric acid, mixtures thereof and the like, and then with a reducing agent, e.g., with formaldehyde or a derivative, bisulfite ion or similar material then a pre-activator and excess oxidizing and reducing agents are then removed, e.g., by rinsing in cold water followed by hot water, and dried. This treatment, which will be exemplified in detail hereinafter, and is more fully described in copending application Ser. No. 20,106, filed Mar. 16, 1970, provides a microporous, polarized surface in which the pores appear to be tree- or fern-like, open to the outside surface, and growing downwardly into the base material, shown greatly exaggerated as 6 in FIG 2. The activated, polarized base may optionally be dried before the next step. In subsequent steps, those pores become filled with metal.

At D, the base material has had applied poison surface layer 8, the purpose of which is to lower the catalytic activity in the vicinity of surface imperfections. This prevents subsequent extraneous electroless metal deposition in random or scattered spots on areas of the surface in which it is not desired. The poison can comprise, in general, any of the compounds or elements disclosed in U.S. Pat. No. 3,443,988, incorporated herein by reference. Preferred poisons, shown by coarse stippling 10 in layer 8 of view D comprise elements selected from sulfur, tellurium, selenium, polonium, arsenic and mixtures of the foregoing. Although the poison is shown in a layer on the surface of the base, or dispersed in a coating on the base, it is to be understood that it can be incorporated throughout the base, or concentrated immediately below the surface, as is explained in U.S. Pat. No. 3,443,998, and the same purpose will be achieved. Depending on the type of poison applied, the base material may then be dried. To facilitate understanding, poison layer 8 is shown greatly exaggerated in thickness in all of the drawings.

At E, the base material is shown covered with layers 12 of the reducible metal salt composition in which metal ions 14 are dispersed. These ions can be in any reducible valence state. Suitable solutions for treating the base to provide layer 12 are fully described hereinabove, and also in above-mentioned copending application Ser. No. 167,435 now U.S. Pat. No. 3,772,078. Treating with the radiant energy sensitive metal reduction solution is carried out by any convenient means, such as spray, roller or curtain coating or, most conveniently by immersing or dipping the base in the solution.

At F is shown the base after draining and drying, then exposure of one side only to radiant energy through a negative mask. This step produces a real image 16 of metal nuclei 18, in uncovered areas, but leaves the unreduced metal 14 in the form of soluble salts in the unirradiated areas. The reduced nuclei 18 are catalytic centers for subsequent electroless metal disposition. To facilitate understanding, a portion of FIG. 2-F is shown magnified, metal ions 14 being shown as $Me^+$ and metal nuclei 18 as $Me°$.

At G, the base is shown after rinsing, e.g., with water or other solvent for the unreduced unexposed metal salts 14, the real image 16, being left standing above the surface (shown greatly exaggerated).

At H is shown the base after treatment with an initial electroless metal bath. This intensifies the image by decomposing to a compound which will exercise a reducing action on the exposed metal salt. Such radiant energy sensitive compounds form a family of scope well known to those skilled in the art. Among them may be mentioned ferric salts, dichromate compounds, anthraquinone and its compounds, amino acids, such as glycine, unsaturated organic compounds such as L-ascorbic acid, cinnamic acid, stilbenes, or azide compounds and the like. Because visible and ultraviolet light are the most convenient sources of radiant energy, the solutions used in this invention perferably contain such compounds which are sensitive to visible or ultraviolet light. Especially preferred are ferric salts, dichromates, and anthraquinone, and derivatives thereof. Illustrative among these are:

a. ferric salts, such as ferric ammonium citrate (green or brown), ferric potassium citrate, ferric ammonium oxalate, ferric sodium oxalte, ferric potassium oxalate, ferric ammonium tartrate, ferric citrate, ferric oxalate, ferric chloride, and the like;

b. bichromate salts, such as those of the general formula $Me_2Cro_3 \cdot CrO_4$ wherein Me is any common metal cation, such as alkali metal, alkaline earth metal, ammonium or substituted ammonium, and the like, e.g., sodium bichromate, potassium bichromate, or mixtures therof with organic substances of animal or vegetable origin such as gelatin, fish glue, gum arabic, shellac, and the like, such as bichromated starch, and the like; and c. anthraquinone or derivatives thereof, such as 9,10-anthraquinone, $\beta$-chloroanthraquinone, $\beta$-phenylanthraquinone, 1,2-benzanthraquinone, anthraquinone-2-sulfonic acid, anthraquinone-2,6(or 2,7-)-disulfonic acid, salts thereof, and particularly anthraquinone 2,6-disodium sulfonate, anthraquinone-2,7-disodium sulfonate, anthraquinone-2,7-dipotassium sulfonate, and the like. Other useful radiant energy sensitive compounds will suggest themselves to those skilled in the art, and a wide variety of such compounds are shown, for example, in standard reference works, such as J. Kosar, Light-Sensitive Systems, Wiley, New York (1965), incorporated by reference.

A preferred ingredient in treating composition is a secondary reducer, such as an organic, oxygen- or nitrogen-containing compound. Such as ingredient serves to facilitate interaction of radiant energy and the radiant energy sensitive compound to provide reduction of the metal salt to the free metal nuclei. Although the secondary reducer compound may be any oxidizable organic compound which is soluble in the solution, does not attack the base material, and is inert to the other ingredients, it is preferred that it comprises a hydroxy compound such as an alcohol or a polyol. Especially preferred as secondary reducing compounds are alcohols or polyols. Among the organic oxygenated compounds can be mentioned, glycerol, ethylene glycol, pentaerythritol, mesoerythritol, 1,3-propanediol, sorbitol, mannitol, 1,2-butanediol, pinacol, sucrose, dextrin, polyethylene glycols, lactose, starch, gelatin, and the like. Especially preferred are glycerol, sorbitol and pentaerythritol.

Instead of the organic oxygenated compound the composition may also include other secondary reducers which serve the same function, including amino compounds, polyethers, certain dyestuffs and pigments. Among these may be mentioned aldehydes, such as formaldehyde, benzaldehyde, acetaldehyde, N-butyraldehyde, polyamides, such as nylon, albumin and gelatin, leuco bases of triphenylmethane dyes such as 4-dimethylaminotriphenylmethane; leuco bases of xanthene dyes such as 3,6-bisdimethylaminoxanthane and 3,6-bisdimethylamino-9-(2-carboxyethyl)xanthene; polyethers, such as ethylene glycol diethyl ether, tetraethylene glycol dimethylether, alizarin, erythiocin, phthalocyanine blue, zirconium silicate and the like.

It has been found that the addition of certain other ingredients of the composition provides unexpected advantages, and such modified solutions are preferred embodiments thereof. Addition of certain of these ingredients hereinafter called metal reduction intensifiers/accelerators/stabilizers, will speed up the exposure time to as little as 2 seconds to 2 minutes (depending on the substrate); some will help bring out the image and provide better contrast; some provide antifogging effects, other lead to better definition and many aid in preventing the image from fading. The advantages provided by these additives, especially, are important advances in the art. For example, image formation can be accelerated; contrast can be improved, the need for the heat intensification can be eliminated and the stability of the image enhanced if to the solution comprising the metal salt and radiant energy sensitive compound are added halogens, e.g., bromides and chlorides, alone or in combination with metals such as tin, alkali metals, mercury, germanium, titanium, molybdenum, rare earths, amines, ammonia and the like. Illustrative of such compounds, are: hydrogen halides and alkali metal or alkaline earth metal, ammonia or amine halides, and the like. Particularly preferred are stannous chloride, hydrogen chloride, hydrogen bromide, potassium chloride, and potassium bromide. In some embodiments the recited compounds may be used with organic acids, such as mono-, di-, tri-carboxylic acids or salts thereof and the like, for example, with acetic acid, citric acid, oxalic acid and the like.

In addition to the metal reduction image intensifiers/accelerators/stabilizers, the composition comprising the metal salt and the radiant energy sensitive compound can include also a surfactant, and this is preferably the base materials which are hard to wet with particular composition employed. The choice of the surfactant is not particularly critical, but usually it is preferred to use a non-ionic surfactant, because this permits a broader range in formulation. Among the suitable surfactants are polyethyleneoxy non-ionic ethers, such as Triton-X 100, manufactured by Rohm & Haas Co., and non-ionic surfactants based on the reaction between nonylphenol and glycidol such as surfactants 6G and 10G manufactured by the Olin Company (See, U.S. Pat. No. 3,514,293). Also suitable are fluorocarbon surfactants such as perfluorodecanoic acid and the series of related compounds manufactured by the 3M company under the product designation, FC-170, and the like.

The treating composition may be formulated within broad concentration ranges, depending primarily on the relative amount of metal salt composition desired to be placed on the base material, which in turn will depend on the mode of application, e.g., immersion, dip coating, roller coating, curtain coating, spraying and the like. In addition, the concentration of the ingredients in solutions will be limited by solubility in the component selected for the carrier or solvent. In general, the metal salt concentration will be pre-determined and the amounts of radiant energy sensitive compound and other ingredients, if present, will be adjusted to provide a ratio which will insure the desired result. This is well within the skill of those familiar with the art of formulating radiant energy sensitive systems. For example, at least enough radiant energy sensitive compound will be present to facilitate substantially complete reduction by exposure to radiant energy of the metal salt to the free metal nuclei. Usually to insure complete reduction, a substantial excess of the radiant energy sensitive compound (based on the reducible metal ions) will be present. The metal salt concentration in solutions can vary over wide limits, e.g., from 0.5 to 100 grams or more per liter can be used, but it is most convenient and economical not to use more than about 25 grams per liter and preferably less than about 15 grams per liter. The radiant energy sensitive compound can comprise from about 1 to 10 or more equivalents, based on the metal salt. The amount of the secondary reducer, e.g., glycerol, pentaerythritol, dyestuff or the like, can likewise vary over a wide range, e.g., from 0.5 to 500 g. per liter, but in the case of liquid, through difficultly volatile compounds, it is preferred not to include so much of such compounds that the treated surface is wet or sticky to the touch after drying. The ingredients, such as halide ions, stannous halides and carboxylic acids added to the compositions as image intensifiers, accelerators, stabilizers, etc., will generally be used in relatively low concentrations, e.g., from trance amounts, e.g., from about 1 mg. per liter up to about 2 grams per liter. Surfactants will be used in small, but conventional quantities, if present. The non-ionics will be used at levels from about 0.1 to 2 grams per liter; and anionics from about 0.1 to 1.0 grams per liter.

| A typical solution will comprise, for example: | |
|---|---|
| reducible metal salt | 0.5 – 50 grams |
| radiant energy sensitive compound (but at least stoichiometric with metal salt) | 1 – 50 grams |
| secondary reducer (glycerol, pentaerythritol, etc.) | 0 – 500 grams |
| image intensifier/accelerator/stabilizer (citric acid, stannous chloride, hydrobromic acid, etc.) | 0 – 2 grams |
| wetting agent (fluorinated hydrocarbon surfactant, polyethylene glycol, nonylphenyl-glycidol reaction product, etc.) | 0 – 2 grams |
| solvent (water, dimethylformamide, alcohol, dioxane, etc.) (to make) | 1000 millileters |

Preferred such solutions will be exemplified hereinafter. Others are also disclosed in copending parent applicaton, Ser. No. 167.435, filed July 29, 1971.

The steps in making printed circuits from an unclad laminate by a direct bonding process combined with the radiant energy imaging technique according to this invention is shown in flow diagram form in FIG. 1 and schematically in FIG. 2.

At A in FIG. 2, there is shown an unclad laminate base material, e.g., of epoxy-glass construction, indicated generally by reference numeral 2.

At B, base material 2 is shown, in exaggerated form for better understanding, after having been pre-activated, e.g., by immersion in a preactivating compound or composition, e.g., a liquid solvent or mixture, such as dimethyl formamide, dimethyl sulfoxide and the like. The sub-adjacent surface areas 4 are shown to have become somewhat roughened, partially softened and to have imbibed a small quantity of the liquid.

At C, the base material is shown after the surface has been treated with an oxidizing agent, e.g., with chromic acid, sulfuric acid, mixtures thereof and the like, and then with a reducing agent, e.g., with formaldehyde or a derivative, bisulfite ion or similar material then a pre-activator and excess oxidizing and reducing agents are then removed, e.g., by rinsing in cold water followed by hot water, and dried. This treatment, which will be exemplified in detail hereinafter, and is more fully described in copending application Ser. No. 20,106, filed Mar. 16, 1970, provides a microporous, polarized surface in which the pores appear to be tree- or fern-like, open to the outside surface, and growing downwardly into the base material, shown greatly exaggerated as 6 in FIG 2. The activated, polarized base may optionally be dried before the next step. In subsequent steps, those pores become filled with metal.

At D, the base material has had applied poison surface layer 8, the purpose of which is to lower the catalytic activity in the vicinity of surface imperfections. This prevents subsequent extraneous electroless metal deposition in random or scattered spots on areas of the surface in which it is not desired. The poison can comprise, in general, any of the compounds or elements disclosed in U.S. Pat. No. 3,443,988, incorporated herein by reference. Preferred poisons, shown by coarse stippling 10 in layer 8 of view D comprise elements selected from sulfur, tellurium, selenium, polonium, arsenic and mixtures of the foregoing. Although the poison is shown in a layer on the surface of the base, or dispersed in a coating on the base, it is to be understood that it can be incorporated throughout the base, or concentrated immediately below the surface, as is explained in U.S. Pat. No. 3,443,998, and the same purpose will be achieved. Depending on the type of poison applied, the base material may then be dried. To facilitate understanding, poison layer 8 is shown greatly exaggerated in thickness in all of the drawings.

At E, the base material is shown covered with layers 12 of the reducible metal salt composition in which metal ions 14 are dispersed. These ions can be in any reducible valence state. Suitable solutions for treating the base to provide layer 12 are fully described hereinabove, and also in above-mentioned copending application Ser. No. 167,435 now U.S. Pat. No. 3,772,078. Treating with the radiant energy sensitive metal reduction solution is carried out by any convenient means, such as spray, roller or curtain coating or, most conveniently by immersing or dipping the base in the solution.

At F is shown the base after draining and drying, then exposure of one side only to radiant energy through a negative mask. This step produces a real image 16 of metal nuclei 18, in uncovered areas, but leaves the unreduced metal 14 in the form of soluble salts in the unirradiated areas. The reduced nuclei 18 are catalytic centers for subsequent electroless metal disposition. To facilitate understanding, a portion of FIG. 2-F is shown magnified, metal ions 14 being shown as $Me^+$ and metal nuclei 18 as $Me°$.

At G, the base is shown after rinsing, e.g., with water or other solvent for the unreduced unexposed metal salts 14, the real image 16, being left standing above the surface (shown greatly exaggerated).

At H is shown the base after treatment with an initial electroless metal bath. This intensifies the image by depositing a layer of electroless metal 20 on the image, the metal nuclei 18 serving as catalytic sites and the intensified image being tightly bonded to the base, through the microporous surface.

The initial bath generally is an electroless metal bath of the type to be described hereinafter, but which has been specially formulated to deposit unusually rapidly a thin continuous layer of metal, e.g., a Group IB or VIII metal, such as copper, nickel, cobalt, gold, silver and the like. Of course, a conventional production bath can be used, but more time should be allowed.

An initial electroless copper image can be produced in only about 10–20 minutes by immersing in the following solution (Example 11, U.S. Pat. No. 3,269,861):

| | |
|---|---|
| copper sulfate | 15 g. |
| Rochelle salt | 15 g. |
| sodium hydroxide | 15 g. |
| formaldehyde (37%) | 35 g. |
| water (to make) | 1000 ml. |

At I is shown the completed printed circuit after building up the conductor pattern on top of the initial layer overlying the real image with a further layer of metal 22. In the method of this invention, this layer 22 can be electrolessly deposited electrically conductive metal, such as a Group IB or VIII metal, and preferably copper, nickel, cobalt, gold or silver. Metal layer 22 can be the same metal or different from the initial layer metal 20, which in turn can be the same or different, depending only on whichever combination of properties, e.g., conductivity, corrosion resistance, abrasion resistance, etc., is desired. After rinsing and drying and, optionally post-curing, e.g., in an oven at about 150°F. for about 2 hours, the final circuit board is obtained in one embodiment.

In all cases, by this procedure, a one-sided printed ciruit according to this invention will be produced in which the conductor patterns are firmly bonded to the base and the thinness of the lines will be limited only by the natural overhang of the electrolessly deposited metal.

Typically, the electroless metal deposition solutions for use in intensifying and depositing electroless metal on the bases having a radiant energy produced real image comprised of catalytic metal nuclei prepared as described herein comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, electroless nickel, electroless cobalt, electroless silver and electroless gold solutions. Such solutions are well known in the art and are capable of autocatalytically depositing the indentified metals without the use of electricity.

Typical of the electroless copper solutions which may be used are those described in U.S. Pat. Nos. 3,095,309 and 3,269,861, both of which are incorporated herein by reference. Conventionally, such solutions comprise a source of cupric ions, e.g., copper sulfate, a reducing agent for cupric ions, e.g., formaldehyde, a complexing agent for cupric ions, i.e. tetrasodium ethylenediamine tetraacetic acid, and a pH adjustor, e.g., sodium hydroxide.

Typical electroless nickel baths which may be used are described in Brenner, *Metal Finishing*, November 1954, pages 68–76, incorporated herein by reference. They comprise aqueous solutions of a nickel salt, such as nickel chloride, an active chemical reducing agent for the nickel salt, such as the hypophosphite ion, and a complexing agent, such as carboxylic acids and salts thereof.

Electroless gold plating baths which may be used are disclosed in U.S. Pat. No. 2,976,181, incorporated herein by reference. They contain a slightly water soluble gold salt, such as gold cyanide, a reducing agent for the gold salt, such as the hypophosphite ion, and a chelating or complexing agnet, such as sodium or potassium cyanide. The hypophosphite ion may be introduced in the form of the acid or salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5 or between 13 and 14, and the ion ratio of hypophosphite radical to insoluble gold salt may be between about 0.33 and 10:1.

A specific example of an electroless copper deposition bath suitable for use is as follows:

| | moles/liter |
|---|---|
| copper sulfate | 0.03 |
| sodium hydroxide | 0.125 |
| sodium cyanide | 0.0004 |
| formaldehyde | 0.08 |
| tetrasodium ethylene-diamine tetraacetate | 0.036 |
| water | remainder |

This bath is preferably operated at a temperature of about 55°C. and will deposit a coating of electroless copper about 1 mil thick in about 51 hours.

A specific example of electroless nickel deposition bath suitable for use is as follows:

| | |
|---|---|
| nickel chloride | 30 g. |
| sodium hypophosphite | 10 g. |
| glycollic acid | 25 g. |
| sodium hydroxide | 12.5 g. |
| water (to make) | 1000 ml. |

The pH is adjusted to 4.5 and the bath temperature is maintained at 95°C.

A specific example of electroless gold deposition solution suitable for used is as follows:

| | |
|---|---|
| gold chloride hydrochloride trihydrate | 0.01 mole/l. |
| sodium potassium tartrate | 0.014 mole/l. |
| dimethylamine borane | 0.013 mole/l. |
| sodium cyanide | 0.4 g./l. |
| water (to make) | 1000 ml. |

The pH is adjusted to 13 and the bath temperature is maintained at 60°C.

A specific example of an electroless silver deposition bath suitable for use is as follows:

| | |
|---|---|
| silver nitrate | 1.7 g. |
| sodium potassium tartrate | 4.0 g. |
| sodium cyanide | 1.8 g. |
| dimethylamine borane | 0.8 g. |
| water (to make) | 1000 ml. |

The pH is adjusted to 13 and the bath temperature is maintained at 80°C.

A specific example of electroless cobalt deposition bath suitable for use is as follows:

| | |
|---|---|
| cobalt chloride | 30 g. |
| sodium hypophosphite | 20 g. |
| sodium citrate dihydrate | 29 g. |
| ammonium chloride | 50 g. |
| water (to make) | 1000 ml. |

The pH is adjusted to 9.5 and the bath temperature is maintained at 90°C.

It is also an embodiment of this invention to produce conductor patterns by the subsequent step of depositing electroplated metal on the electroless metal — either on initial layer 16 as in FIG. 2 or an ordinary electroless metal layer 22, either alone or on top of an initial layer. In any event, in a continuously interconnected circuit the initial layer of an electroless metal layer or both can serve as the common cathode for electroplating. In all other cases, electroplating in selected areas can be carried out by brushing plating or, for example, by the method disclosed in Polichette, U.S. Pat. No. 3,334,026. The real image itself will not be electrically conductive enough to permit electroplating without intervening electroless plating.

The electroplating can comprise more of the same metal or a different metal, e.g., copper, nickel, cobalt, silver, gold, rhodium, tin, alloys thereof and the like. Electrolytic plating procedures are conventional and well known to those skilled in the art.

For example, a pyrophosphate copper bath is commercially available for operation at a pH of 8.1 to 8.4, a temperature of 50°C., and a current density of 50 amp./sq.ft. In addition, a suitable fluoborate copper bath is operated at a pH of 0.6 to 1.2, a temperature of 25°–50°C., and a current density of 25 to 75 amp. per sq. ft. and is comprised of:

| | |
|---|---|
| copper fluoborate Cu(BF$_4$)$_2$ | 225 – 450 g./l. |
| fluoboric acid, HBF$_4$ | 2 – 15 g./l. |
| boric acid | 12 – 15 g./l. |

For printed circuits, copper deposits for use as the basic conductor material will usually be from 0.001 to 0.003 in. thick.

Silver may be deposited electrolytically from a cyanide bath operated at a pH of 11.5 to 12, a temperature of 25°–35°C., and a current density of 5–15 amp./sq.ft. An illustrative electrolytic silver bath is comprised of:

| | |
|---|---|
| silver cyanide, AgCN | 50 g./l. |
| potassium cyanide, KCN | 110 g./l. |
| potassium carbonate, K$_2$CO$_3$ | 45 g./l. |
| brighteners | variable |

Gold may be deposited electrolytically from an acid gold citrate bath at pH 5–7, a temperature of 45°–60°C., and a current density of 5–15 amp./sq.ft. An illustrative electrolytic gold bath consists of:

| | |
|---|---|
| sodium gold cyanide, NaAu(CN)$_2$ | 20 – 30 g./l. |
| dibasic ammonium citrate (NH$_4$)$_2$C$_6$H$_5$O$_7$ | 25 – 100 g./l. |

Nickel can be electrolytically deposited at pH 4.5 to 5.5, a temperature of 45°C. and a current density of 20 to 65 amp./sq.ft., the bath containing:

| | |
|---|---|
| nickel sulfate, NiSO$_4$.6H$_2$O | 240 g./l. |
| nickel chloride, NiCl$_2$.6H$_2$O | 45 g./l. |
| boric acid, H$_3$BO$_3$ | 30 g./l. |

Tin and rhodium and alloys can be electrically deposited by procedures described in Schlabach et al, "Printed and Integrated Circuitry," McGraw-Hill, New York, 1963, p. 146–148.

Among the preferred embodiments of this invention are processes to prepare circuits in which the conductor pattern, built up as described above, is coated with solder. This is especially useful when it is contemplated to solder lugs or other hardware to the pattern. Processes for solder coating printed circuits, e.g., by dip soldering or by electroplating solder or both are well known. For example, the board is dipped in a flux bath. After excess flux has drained from the board, it is placed pattern down on or under the molten solder bath. A 60-tin 40-lead solder can be used, for example, at a temperature between 435° and 55°F.; the higher the temperature, the shorter the time of the dip. For instance, at 435°F. the dip time might be 10–12 seconds for the average size assembly. Removing the printed circuit slowly and evenly from the solder bath leaves a smooth even deposit of solder on the conductors. It helps to remove any excess solder if the board is mechanically or hand slung as it is withdrawn from the bath. If desired, any flux remaining on the board can be removed in a solvent bath or in a vapor degreaser. Mechanized soldering systems can also be used, for example, machines in which a fountain of molten solder is directed against the circuit boards. Suitable soldering machines are shown, for example, in U.S. Pat. Nos. 3,416,958; 3,491,779; 3,483,616; 3,393,659; 3,200,788 and 3,359,132. One especially useful machine and method, particularly for boards with through hole connectors is described in copending U.S. Ser. No. 40,682, filed May 26, 1970 now U.S. Pat. No. 3,661,638. The method described therein comprises dip coating the circuit board in a solder bath then removing the board to a bath of hot heat transfer fluid, e.g., hot oil or wax and gyrating the board until the excess solder flows off by circumferentially and axial flow.

It is also among the preferred embodiments of this invention to produce holes, pathways around the edge or through slots to connect from the top to the bottom of the base material. While these can be and have been conventionally formed by electrodeposition of metal, such techniques are disadvantageous. For example, electrodeposition of copper leaves a non-uniform deposit of metal over the edges of the hole. The plating of the lateral walls of the holes diminishes from the surface towards the central part of the insulating hole. It is extremely difficult, therefore, to control the size of plated through holes where electrodeposition is employed. These advantages have been overcome by rendering the pathways sensitive to electroless metal plating with precious metal sensitizers and building up conductive pathways by electroless metal deposition. In addition to being expensive and somewhat unstable, such sensitizers lead often to flash deposition of precious metal and poor adhesion. According to the present invention, precious metal sensitizing baths are dispensed with, and irradiation of the pathway causes depostion of the reduced metal nuclei thereon. This serves as a base for an initial plate or electroless metal plate which is smooth, adherent and conductive. An important advantage is that such conductive plating on the aperture wall is uniform in thickness from the outside into the inside of the base. If this is used as a cathode for electroplating, the electroplated metal will build up in uniformly thick layers. And, if solder plating is used, the solder on the pathway surfaces will also be in a uniform layer.

Figure 5:
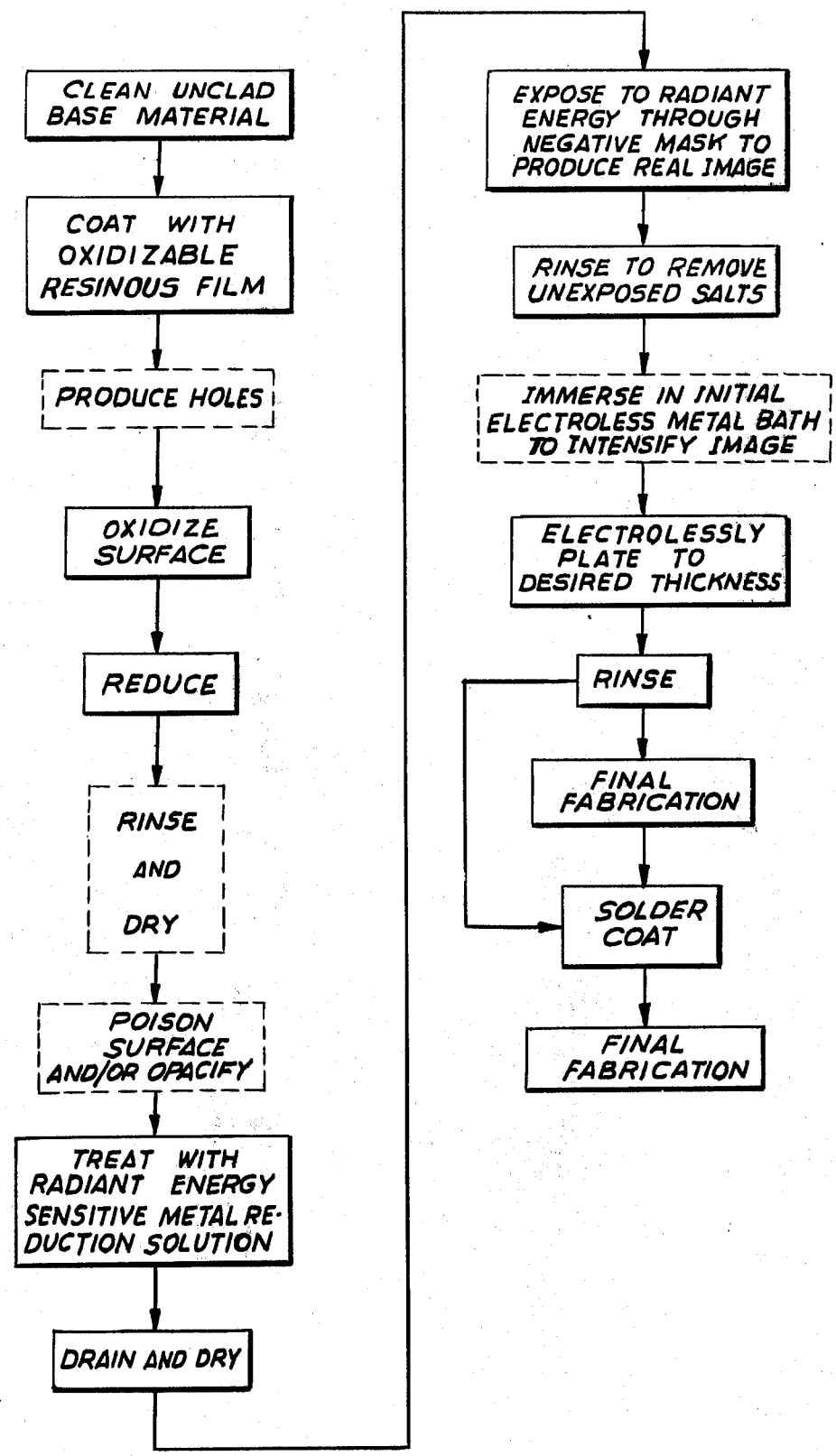
FIg. 5 is a flow diagram showing the steps in making printed circuits according to various embodiments of the present invention, using a oxidizable resinous coating technique to provide bonding to the base material.
Figure 6:
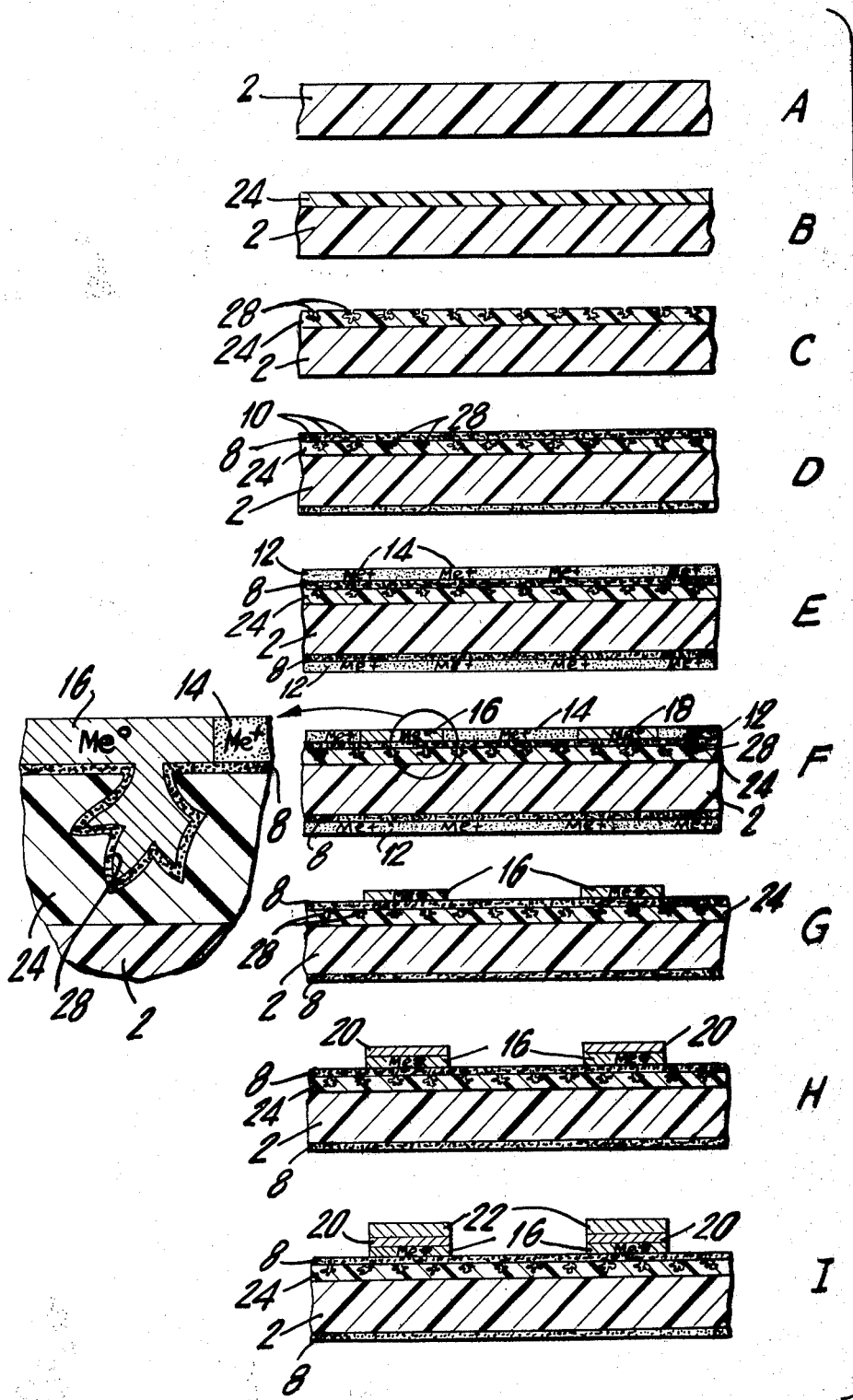
FIG. 6 is a schematic illustration showing the steps in making a one sided printed circuit according to the method of FIG. 5.

The steps in making printed circuits from an unclad laminate by a microporous resin layer bonding process combined with the radiant energy imaging technique according to this invention is shown in flow diagram form in FIG. 5 and schematically in FIG. 6.

At A in FIG. 6, there is shown an unclad laminate base material, e.g., of epoxy-glass or phenolic-paper or similar construction, indicated generally by reference numeral 2.

At B, base material 2 is shown after having coated, e.g., by dipping, spraying, roller coating, curtain coating, and the like with oxidizable resin layer 24, e.g., of rubber, phenolic, acrylate, etc., or a resin containing dispersed oxidizable rubber, e.g., natural or synthetic rubber, particles. In addition to oxidizable resins, a suitable particle containing layer former is as follows:

| | |
|---|---|
| epoxy resin | 15 g. |
| butadiene-acrylonitrile rubber (10 micron particle size) | 15 g. |
| diacetone alcohol | 50 g. |
| toluene | 50 g. |
| oil soluble phenol formaldehyde resin | 11 g. |
| fumed colloidal silica | 25 g. |

These and other suitable compositions and methods for their application are disclosed in U.S. Pat. No. 3,625,758, incorporated herein by reference.

At C, the coated base material is shown after exposure to an oxidizing agent, e.g., potassium bichromate, 37 g., water, 500 ml. and concentrated sulfuric acid, 500 ml., or a permanganate solution, for about 30 minutes at room temperature then treatment with a neutralizer, e.g., a slightly acid 5% sodium sulfite solution and a water rinse. Such a treatment provides the base with layer 24 having miropores 28 in the surface caused by oxidation and degradation. If rubber particles are present, but the resin itself is not oxidizable, micropores 28 2ill result also. The preparation of the rubber particles containing substrates, which have a uniquely efficient surface for forming tightly held conductor patterns, is described in the above mentioned U.S. Pat. No. 3,625,758. The base may optionally be dried before the next step.

At D, the base material has had applied poison surface layer 8, the purpose of which is to lower the catalytic activity in the vicinity of surface imperfections. This step has been described above in explaining FIG. 1 and a suitable poison is, for example, 2-mercaptobenzothiazole, shown by course stippling 10, in FIG. 6.

At E, the base material is shown covered with layer 12 of reducible metal salt composition in which metal ions 14 are dispersed, the ions being of any reducible valance state. Suitable solutions and methods for surface treating are described above with reference to the corresponding step in FIG. 2.

At F is shown the base after draining and drying, then exposure of one side to radiant energy through a negative mask. This step produces a real image 16 of metal nuclei 18, in exposed areas, but leaves the unreduced metal 14 in the form of soluble salts in the covered, unirradiated areas. The reduced nuclei are catalytic centers for subsequent electroless metal deposition.

At G, the base is shown after rinsing, e.g., with water or other solvent for the unreduced unexposed metal salts 14, the real image 16, being left standing above the surface (shown greatly exaggerated).

At H is shown the base after treatment with an initial electroless metal bath, of the type described above. This intensifies the image by depositing a layer of electroless metal 20 on the image, the metal nuclei 18 serving as catalytic sites and the intensified image being tightly bonded to the base, through the microporous adhesive layer.

At I is shown the completed printed circuit after building up the conductor pattern on top of the initial layer overlying the real image with a further layer of metal 22. In the method of this invention, layer 22 can be any electrolessly deposited electrically conductive metal, such as a Group IB or VIII metal, and preferably copper, nickel, cobalt, gold or silver. Metal layer 22 can be the same metal or different, or any combination thereof, as described above with reference to FIG. 2. Combinations can be provided to meet conductivity, wear, ductility and other desirable properties.

After rinsing and drying, the final circuit board is obtained.

Electroless plating baths, electroplating baths, solder coating processes, through-hole plating and other process steps described above with reference to FIGS. 1 and 2 can be used with this embodiment, are contemplated by this invention, and will be exemplified hereinafter.

By such techniques printed circuits according to this invention will be produced in which the conductor patterns are firmly bonded to the base of the thinness of the lines will be limited only by the natural overhang of the electrolessly deposited metal. In addition to the above substrates and methods, the present radiant energy formed patterns can be applied to other bases with conventional modifications to secure bonding. For example, polyimide and polyester films and boards can be used with simple chemical cleaning operations. Or "B-stage" resin constructions, e.g., partially cured phenolic laminates or catalyzed polyester or epoxy laminates can have radiant energy formed patterns applied to their surfaces than be cured and have the conductive pattern built up by the above described methods to provide printed circuits with any desired combination of properties.

The present invention will also be useful on such substrates as paper, woven and non-woven fabrics, vulcanized fiber, cardboard, wood and wood composites, and the like.

DESCRIPTION OF THE PREFERRED EMBODIMENTS

The following examples illustrate the production of printed circuit boards according to the present invention. They are not to be construed as limiting the claims to the steps shown.

EXAMPLE 1

Figure 3:
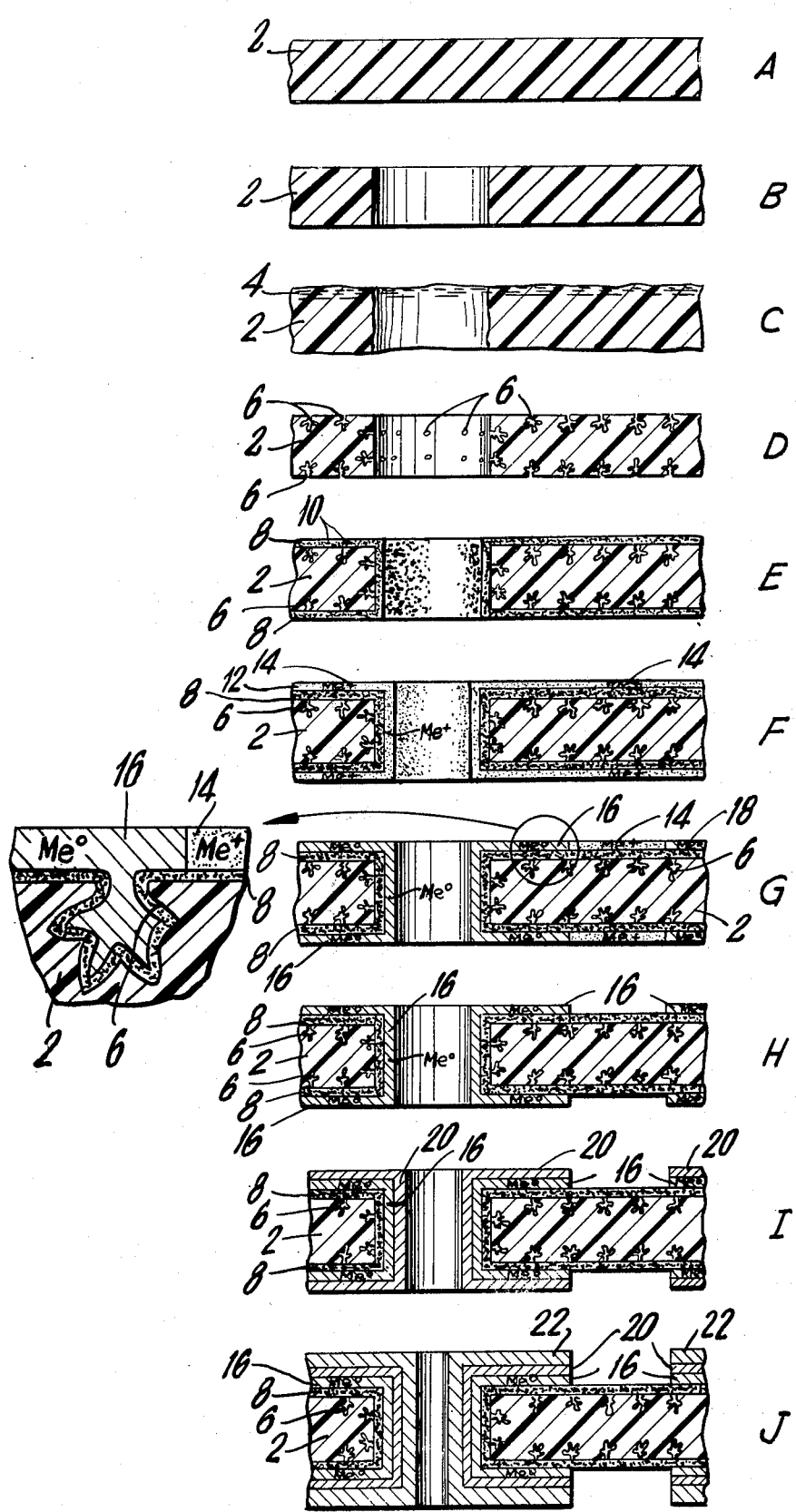
FIGS. 3 and 4 are schematic illustrations showing the steps in making two-sided printed circuits with plated through holes according to the method of FIG. 1, FIG. 4 illustrating the solder coating or electroplating final step.

The process of this example produces a printed circuit on a base material with a normally non-polar surface, the printed circuit having plated through holes, and the process is illustrated step-wise in FIG. 3 A–J.

An unclad epoxy-glass laminate, 0.0600 inches thick is drilled or punched to provide holes at the desired location and is cleaned by wet scrubbing with pumice and dried. It is immersed in 15 g./l. of 2,2'-dihydroxy-4,4'-dimethoxybenzophenone (ultraviolet absorber) in methylene chloride, air dried, for 15 minutes at 23°C., then quick-rinsed with 1,1,1-trichloroethane (15 sec.).

The clean panel with holes (FIG. 3B) is pre-activated by immersion in a 1:1 by volume mixture of dimethyl formamide and 1,1,1-trichloroethane at about 23°C. for about 1 minute, then removed and drained in air for 2 minutes. This provides pre-activated surface layers 4.

The pre-activated panel (FIG. 3C) is then immersed in an oxidizer bath comprised of chromic acid, 100 g./l., sulfuric acid, 300 ml./l., balance water, for 5 minutes at about 45°C., drained for about 1 minute and then rinsed with water for about 1 minute.

The pre-activated, oxidized panel is immersed in a reducer solution comprising 20 g. of sodium bisulfite, 1 ml. of sulfuric acid and water to make 1 liter, for about 5 minutes at about 23°C. This provides microporous, treed and activated surface areas 6.

The panel, having microporous, treed, polarized and wettable surface (FIG. 3D) is treated to remove most of the pre-activating agent and excess oxidizer and reducer, by rinsing in cold water, 15–20°C., for about 5 minutes, and then in hot water, about 80° to 95°C., for about 5 to 10 minutes, then oven dried for about 10 minutes at about 120°–140°C.

Layer 8 of poison to retard extraneous metal deposition is put on the panel and in the hole walls by dipping in a solution of 0.25 g./l. of nickel dibutyldithiocarbamate in methylene chloride for about 2 to 4 minutes (FIG. 3E), then the poisoned panel is air dried and oven dried at about 120°–140°C. for about 10 minutes and cooled.

Layer 12 of reducible metal compound is put on the panel by immersion for about 2 to 5 minutes at about 20° to 25°C. in a metal reduction bath of the following composition:

| | |
|---|---|
| cupric acetate | 8 g. |
| pentaerythritol | 50 g. |
| sorbitol | 60 g. |
| citric acid | 40 g. |
| anthraquinone 2,6-disulfonic acid disodium salt | 16 g. |
| stannous chloride | 0.8 g. |
| Surfactant 6G (Olin Corp., a para-isononylphenoxy-polyglycidol containing an average of about 6 glycidol units) | 1.5 g. |
| water (to make) | 1000 ml. |

(the stannous chloride and surfactant are added after the other ingredients have been mixed). The board is drained for 1 minute then is dried to the touch in a moderate temperature oven, 50°C., for the minimum time necessary, 2–4 minutes (FIG. 3F).

The radiant energy sensitive panel (FIG. 3F), transferred and stored in the dark or in yellow light, is covered on both sides with negatives corresponding to the circuit patterns and both sides are exposed to ultraviolet light (mercury vapor lamp) for 30 seconds to 2 minutes and the negatives are removed. Real image 16 of reduced copper nuclei $Me^\circ$ shows grey to black.

The exposed pane is rinsed with water for about 1 minute at about 20°–25°C. to remove unexposed salts and to leave real image 16 standing above and below the surfaces and in the hole walls (FIG. 3H).

The real images are intensified, made electrically conductive and darker by immersion of the base in an initial copper bath of the following formulation:

| | |
|---|---|
| copper sulfate | 15 g./l. |
| Rochelle salts (sodium potassium tartrate) | 15 g./l. |
| sodium hydroxide | 15 g./l. |
| formaldehyde (37%) | 35 ml./l. |
| water (to make) | |

After 5–10 minutes at about 20°–25°C., initial layers 20 of copper metal have been deposited.

The panel is then placed in a production-type electroless copper bath of the following formulation:

| | |
|---|---|
| copper sulfate | 0.03 moles |
| sodium hydroxide | 0.125 moles |
| sodium cyanide | 0.0004 moles |
| formaldehyde | 0.08 moles |
| tetrasodium ethylenediamine tetraacetate | 0.030 moles |
| water | remainder |

The bath is operated at about 55°C. and conductor layers 22 of the desired thickness, 0.8 to 2 mils is built up in from about 24 to 30 hours.

The printed circuit board is then washed for about 10 minutes in running water then post-cured in an oven for about 1 hour at about 160°C. It can be brushed, if desired, and coated with a varnish, if desired, to prevent finger marks an corrosion, then final fabrication. The circuit lines can be made very thin by this process and highly resolved, there is no print through, and bond strengths between the conductor patterns and the base are very high.

EAMPLES 2 and 3

Figure 4:
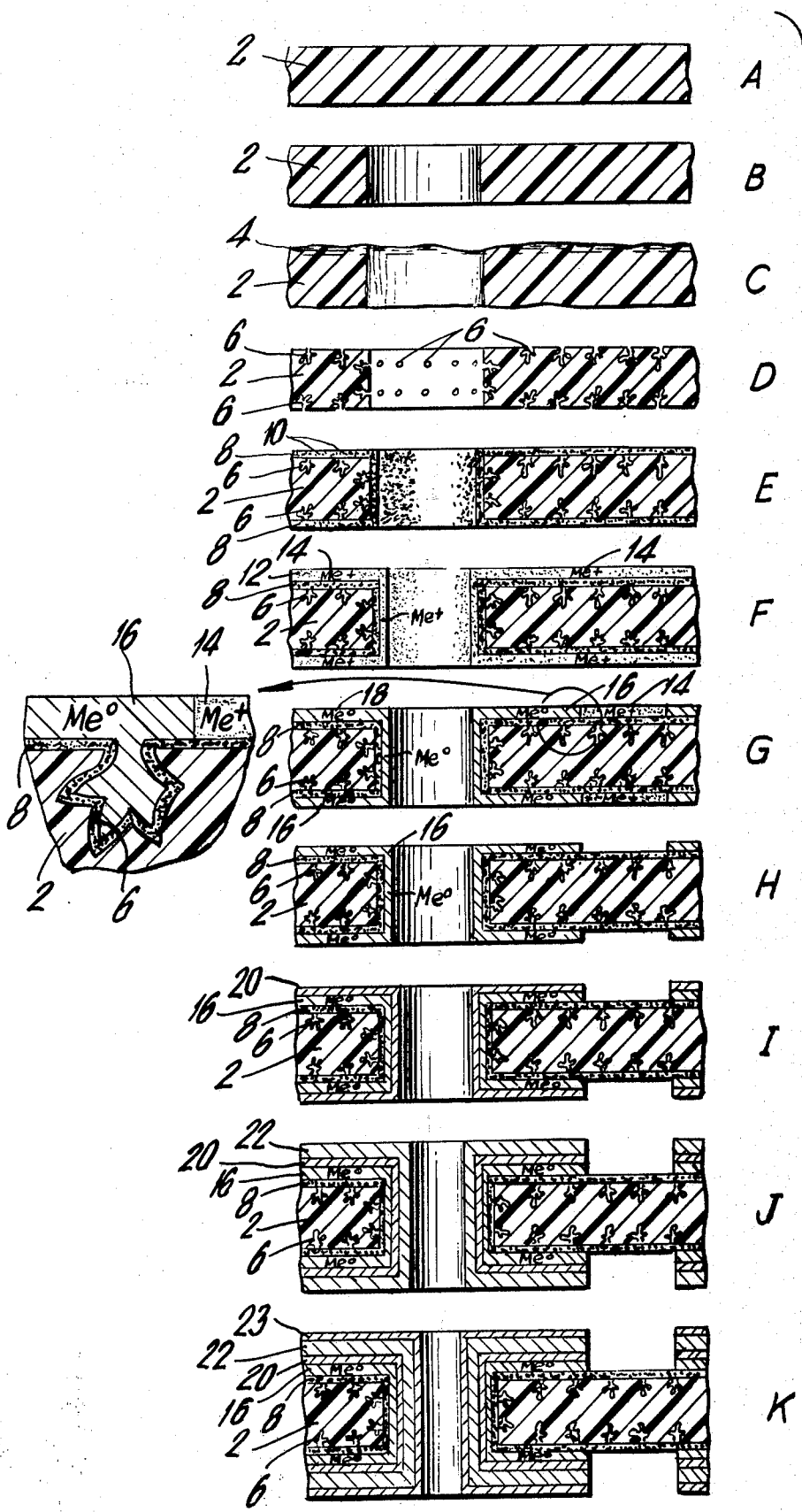

The process of these examples produce printed circuits with plated through holes, having solder plated or other electroplated metal conductor patterns, and is illustrated step-wise in FIG. 4 A–K.

Solder-plating

The procedure of Example 1 is repeated through the post-cure step (FIG. 4-J).

The printed circuit board is then dipped into flux then into a 60-tin 40-lead solder bath at about 500°F. for about 8 seconds. Excess solder is then removed from the board and the plating is smoothed out by placing the board in a wax bath at about 500°F., and oscillating in an orbital leveling machine of the type descibed in U.S. Ser. No. 40,682, filed May 26, 1970 now U.S. Pat. No. 3,661,638. This board is illustrated in FIG. 4, view I, metal layer 23 representing the solder plate on the circuit pattern and in the hole wall. Any remaining flux or other material can be easily brushed off, washed off or removed in any other similar matter before final fabrication.

Electroplating

The procedure of Example 1 is repeated through the initial electroless plating step (FIG. 4-I).

The initial copper plate continuous circuit is used as a cathode in a conventional electroplating circuit and the board is immersed in a copper electroplating bath of the following composition:

| | |
|---|---|
| copper fluoborate | 225 – 450 g./l. |
| fluoboric acid | 2 – 15 g./l. |
| boric acid | 12 – 15 g./l. |

The pH is maintained at 0.6 to 1.2, temperature at 25° to 50°C. and a current density of 25 to 75 amps. per square foot is applied. Electroplated copper layers 23 of from about 0.001 to 0.003 inches thickness is built up on the conductor patterns and in the hole walls. Rinsing and post-curing are as described in Example 1. The circuit board is shown in FIG. 4K. Discontinuous circuits can be electroplated by a brush technique, or see U.S. Pat. No. 3,334,026.

Alternatively, an intervening layer of electroless metal (not shown) is deposited on the initial copper plate by the procedure of Example 1 and then electroplated copper is added as a top layer.

EXAMPLE 4

Figure 7:
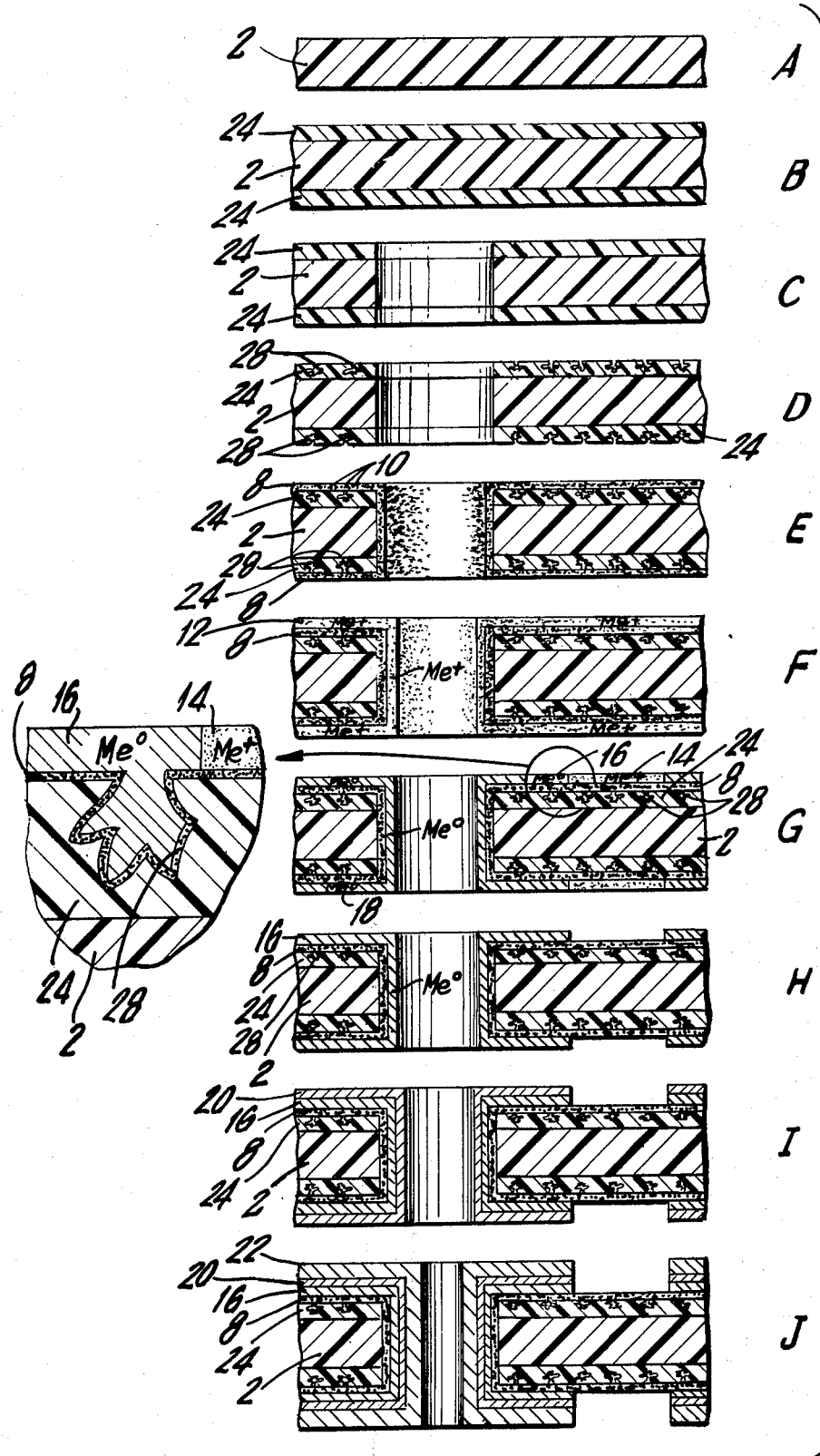
FIGS. 7 and 8 are schematic illustrations showing the steps in making two-sided printed circuits with plated through holes according to the method of FIG. 5, FIG. 8 illustrating the solder coating or electroplating final step.

The process of this example produces a printed circuit with plated through holes from a normally nonpolar base material and is illustrated step-wise in FIG. 7 A–J. An unclad phenolic-paper laminate is scrubbed clean in a brushing machine and the moisture is blown off in an air jet. It is coated with an ultraviolet light barrier as described in Example 1.

Base material 2 (FIG. 7A) is passed under a curtain coater and covered with an oxidizable adhesive layer 24, the coating composition being of the following formula (U.S. Pat. No. 3,525,758, Example 1, Mixture B):

| | |
|---|---|
| Epoxy resin (epichlorohydrin derivative) | 15 g. |
| butadiene-acrylonitrile rubber | 15 g. |
| diacetone alcohol | 50 g. |
| toluene | 50 g. |
| oil soluble phenol formaldehyde resin | 11 g. |
| fumed colloidal silica | 25 g. |

The coated base is oven dried at 160°C. for about 1 hour (FIG. 7B).

Holes are drilled or punched at the desired locations (FIG. 7C). The base is scrubbed to remove dust particles then passed through a water knife cleaning apparatus.

The base is transferred to an oxidizer comprising 20 g./liter of sodium dichromate in concentrated $HBF_4$ (48%) maintained at about 40°C., for about 10 minutes. This produces a microporous surface 28 in adhesive layer 24, by oxidizing the surface (FIG. 7D). The board is rinsed then transferred to a neutralizer bath comprising slightly acidic 5% sodium bisulfite solution or dilute aqueous formaldehyde solution.

Then, proceeding as outlined in Example 1, poison layer 8, comprising in this instance 2-mercaptobenzothiazole, is put on the base, (FIG. 7E). Also, and analogously to Example 1, the board is coated with a radiant energy sensitive layer 12; covered with negatives and exposed to ultraviolet light to produce real images 16 (FIG. 7G); unexposed metal salts are removed by rinsing with water to produce a relief of real images 16 (FIG. 7H); these images are intensified with the initial electroless copper plate 20 (FIG. 7I); and followed by electrolessly plated copper layer 22 (FIG. 7J). In this embodiment, the post-cure step can be eliminated, and after rinsing the surface, and protecting with a thin varnish coat, if desired, the printed circuit board is ready for final fabrication. The circuit lines by this process too can be made very thin and highly resolved, there is no "print-through", and bond strengths between the conductor pattern and the base are very high.

EXAMPLES 5 and 6

Figure 8:
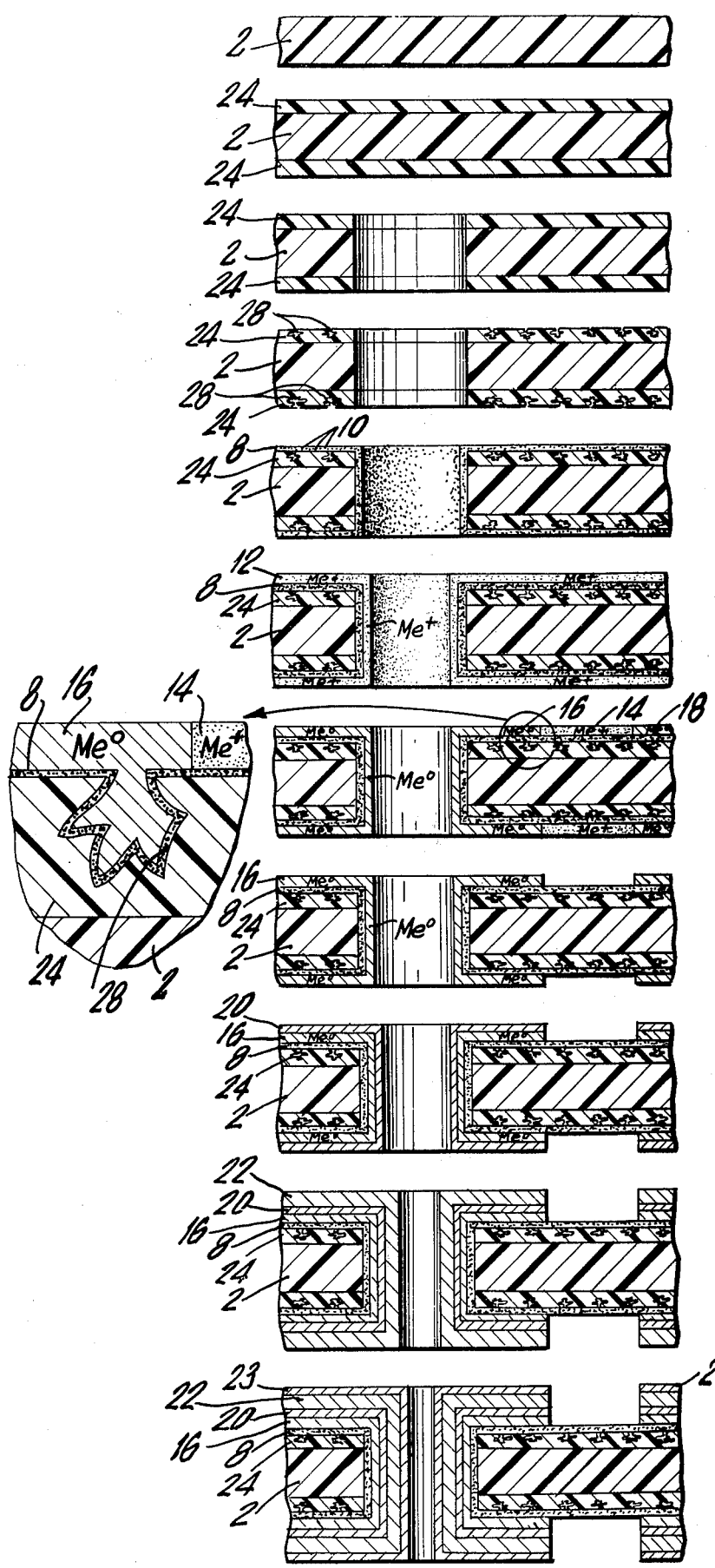
Figure 9:
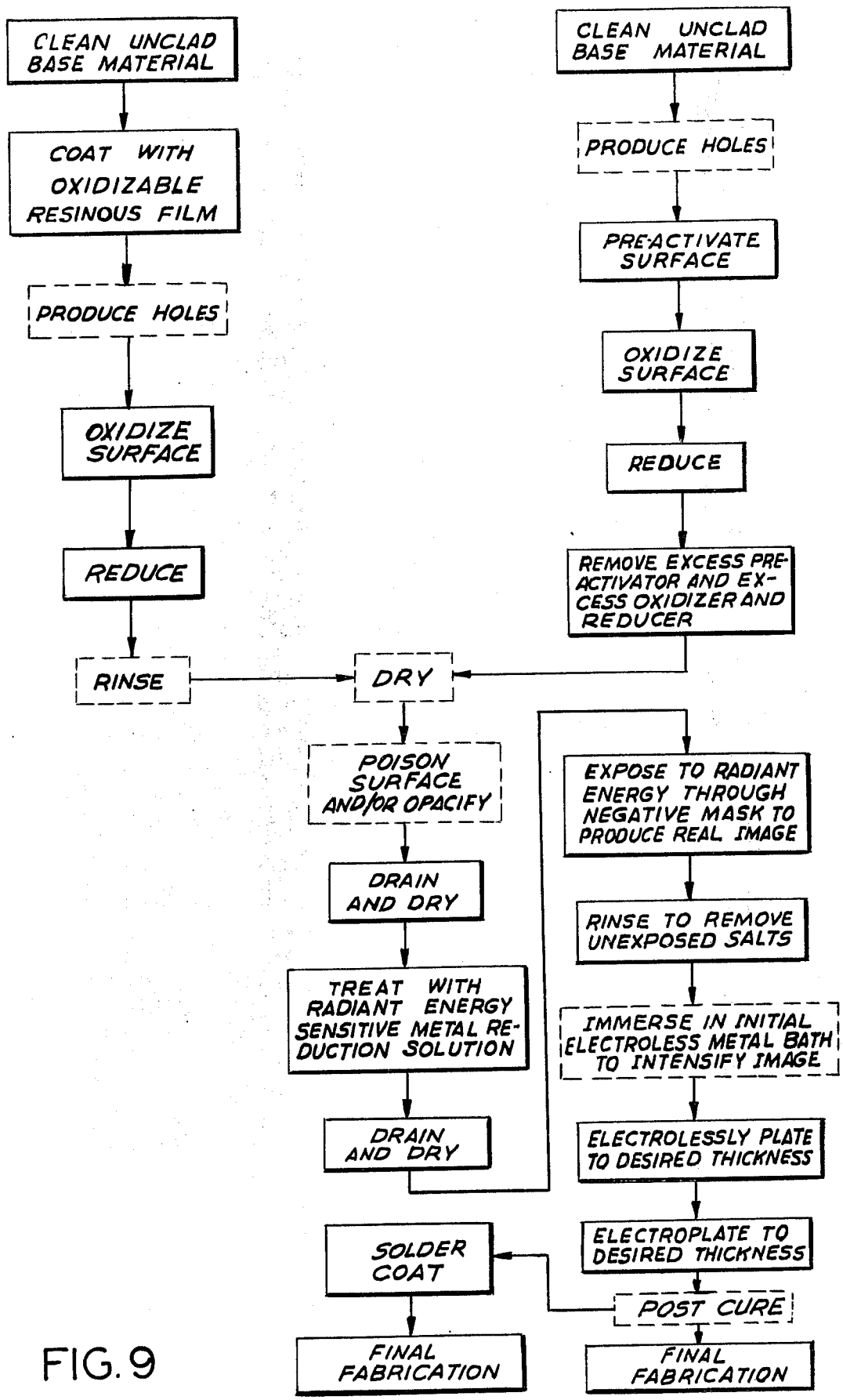
FIGS. 9 and 10 are flow diagrams showing the steps in making printed circuits according to various other embodiments of the present invention.
Figure 10:
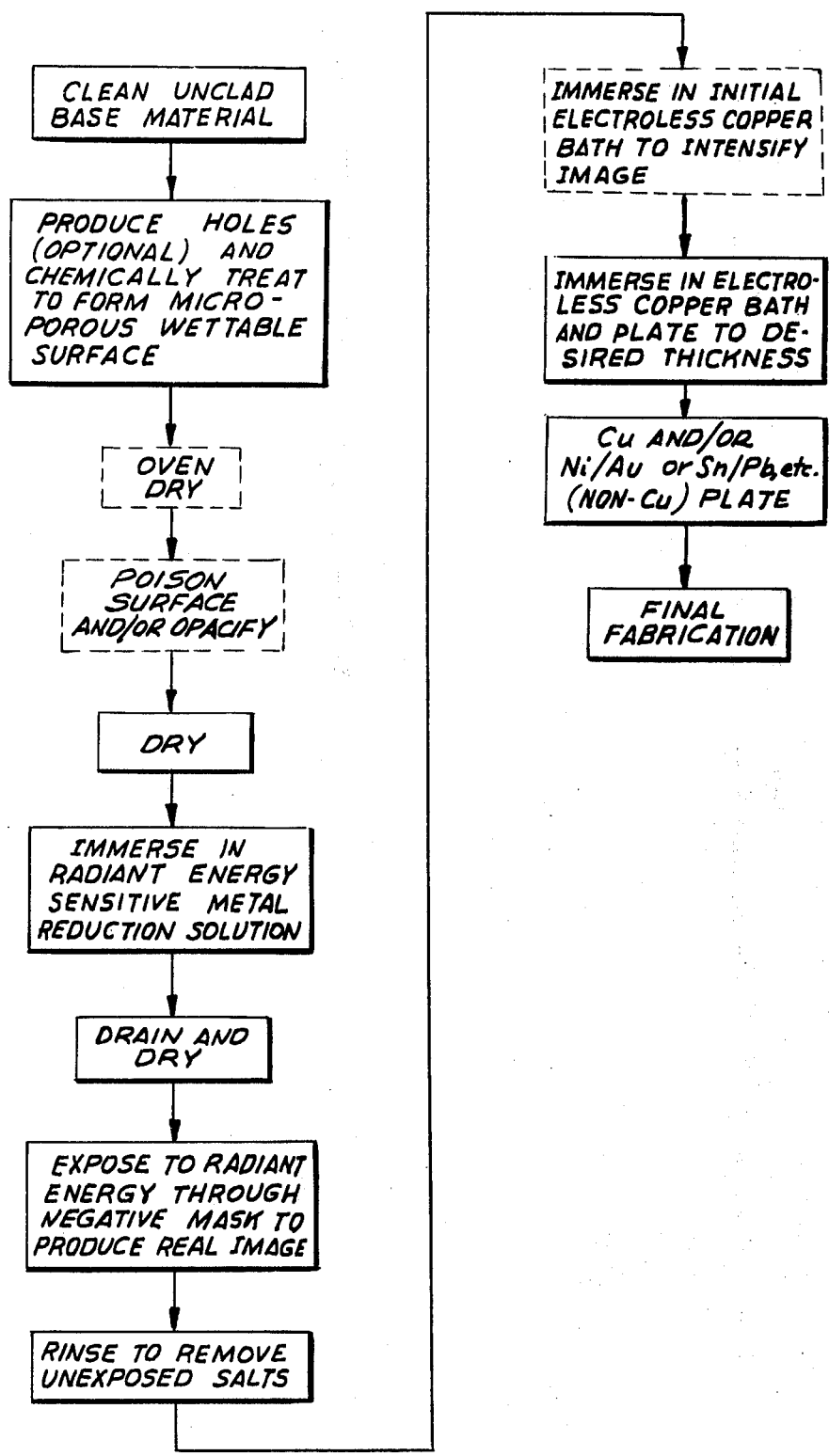

The process of these examples produce printed circuits with plated-through holes having solder plated or electroplated conductor patterns and are illustrated step-wise in FIG. 8 A–K.

Solder plating

The procedure of Example 4 is repeated through the electroless plating step (FIG. 7J).

The printed circuit board is dipped into flux then into a 60-tin 40-lead solder bath at about 500°F. for about 8 seconds. Excess solder is then removed from the board and the plating is smoothed out as described in Example 2. This printed circuit is illustrated in FIG. 8K, layer 23 representing the solder plate on the circuit pattern and in the hole wall.

Electroplating

The procedure of Example 4 is repeated through the initial electroless plating step (FIG. 4I).

The initial electroless copper printed circuit board is used as a cathode in a conventional electroplating circuit and the board is immersed in a copper electroplating bath and plated as described in Example 3. Electroplated copper layers 23 of from about 0.001 to 0.003 thickness are built up on the conductor pattern and in the hole walls. Rinsing and protective steps are as described in Example 4. The circuit board is shown in FIG. 8K.

Alternatively, an intervening layer of electroless metal (not shown) is deposited on the initial copper plate and then electroplated copper is added as top and bottom layers.

Obviously many modifications of the above specific examples can be carried out following teachings herein. By way of illustration, other substrates can be substituted as base materials for epoxy-glass or phenolic-paper laminates. Mylar, polyethylene terephthalate, film can be used, in the process of Example 4, if the surface is roughened to enhance adhesion, in known ways, either by treating with sulfuric acid or by sand blasting. Instead of a mylar film, other films such as polyimides can be employed as substrates. In addition, ceramic substrates, e.g., porcelain, steatite, and the like can also be used.

Many different radiant energy sensitive metal reduction compositions may be used and the other forms of radiation can comprise instead of ultraviolet light, for example, visible light, infrared radiation, electron beams, gamma rays, beams of alpha or neutron particles, and the like.

Instead of the copper acetate metal reduction described in Examples 1 and 4, the following radiant energy sensitive compositions may be substituted.

EXAMPLE 7

| | |
|---|---|
| cupric formate | 10 g. |
| anthraquinone 2,6-disulfonic acid disodium salt | 2 g. |
| glycerol | 10 g. |
| water (to make) | 1000 ml. |

EXAMPLE 8

| | |
|---|---|
| cupric acetate | 8 g. |
| pentaerythritol | 50 g. |
| citric acid | 40 g. |
| anthraquinone 2,6-disulfonic acid disodium salt | 16 g. |
| stannous chloride | 0.5 g. |
| Surfactant 6G (Olin Corp.) | 1 g. |
| water (to make) | 1000 ml. |

EXAMPLE 9

| | |
|---|---|
| cupric formate | 10 g. |
| anthraquinone 2,6-disulfonic acid disodium salt | 3 g. |
| glycerol | 30 ml. |
| citric acid | 30 g. |
| stannous chloride | 1 g. |
| fluorocarbon wetting agent (3-M Co., FC-170) | 0.25 g. |
| water | 450 ml. |

EXAMPLE 10

Prepare Part A:
| | |
|---|---|
| cupric gluconate | 15 g. |
| water | 200 ml. |

Prepare Part B:
| | |
|---|---|
| fluorocarbon wetting agent (FC-170) | 0.1 g. |
| glycerol | 30 g. |
| citric acid | 30 g. |
| anthraquinone 2,6-disulfonic acid disodium salt | 2 g. |
| stannous chloride | 1 g. |
| water | 250 ml. |

Mix A and B.

EXAMPLES 11 and 12

Prepare Part A:
| | | |
|---|---|---|
| cupric acetate | 15 g. | — |
| cupric nitrate | — | 15 g. |
| water | 200 g. | 200 g. |

Prepare Part B:
| | | |
|---|---|---|
| wetting agent (FC-170) | 0.25 g. | 0.25 g. |
| glycerol | 30 g. | 30 g. |
| citric acid | 30 g. | 30 g. |
| anthraquinone 2,6-disulfonic acid disodium salt | 3 g. | 3 g. |
| water | 250 g. | 250 g. |
| stannous chloride | 1 g. | 1 g. |

Mix A and B.

EXAMPLE 13

Prepare Part A:
| | |
|---|---|
| silver nitrate | 5 g. |
| water | 200 g. |

Prepare Part B:
| | |
|---|---|
| wetting agent (FC-170) | 0.25 g. |
| glycerol | 30 g. |
| citric acid | 30 g. |
| anthraquinone 2,6-disulfonic acid disodium salt | 3 g. |
| water | 250 g. |

Mix A and B:

EXAMPLE 14

| | |
|---|---|
| silver nitrate | 1 g. |
| acetone (to make) | 1000 ml. |

The following metal reduction compositions use ferric ammonium sulfate or L-ascorbic acid as the sensitizing compound:

EXAMPLE 15

| | |
|---|---|
| cupric acetate | 1.3 g. |
| ferric ammonium sulfate | 3.5 g. |
| pentaerythritol | 20 g. |
| glycerol | 16 g. |
| citric acid | 10 g. |
| Surfactant 6G (Olin Corp.) | 0.3 g. |
| water (to make) | 1000 ml. |

EXAMPLE 16

| | |
|---|---|
| cupric acetate | 4 g. |
| L-ascorbic acid | 5 g. |
| pentaerythritol | 25 g. |
| sorbitol | 30 g. |
| citric acid | 20 g. |
| stannous chloride | 0.5 g. |
| Surfactant 6G (Olin Corp.) | 0.5 g. |
| water (to make) | 1000 ml. |

The following metal reduction compositions use nickel, cobalt and iron salts as the reducible image forming metal component.

EXAMPLES 17–19

| Example | 17 | 18 | 19 |
|---|---|---|---|
| nickelous sulfate | 6 g. | — | — |
| cobaltous sulfate | — | 6 g. | — |
| ferrous sulfate | — | — | 6 g. |
| pentaerythritol | 50 g. | 50 g. | 50 g. |
| sorbitol | 60 g. | 60 g. | 60 g. |
| glycerol | 10 ml. | 10 ml. | 10 ml. |
| citric acid | 40 g. | 40 g. | 40 g. |
| anthraquinone 2,6-disulfonic acid disodium salt | 16 g. | 16 g. | 16 g. |
| stannous chloride | 1 g. | 1 g. | 1 g. |
| wetting agent (Surfactant G) | 1 g. | 1 g. | 1 g. |
| water (to make) | 1000 ml. | 1000 ml. | 1000 ml. |

The amount of metal salt can vary between 4 and 8 g. without any significant effect on image formation.

The above examples include compositions which contain metal reduction intensifiers/accelerators/stabilizers and surfactants. One composition is also shown which omits a secondary reducer, i.e., an organohydroxy compound. The above compositions thus demonstrate that the present process can be carried out with solutions comprising only two essential ingredients, namely, the reducible metal salt and a radiant energy sensitive compound.

In addition to copper plating, other metals can be used to form the conductor patterns overlying the image.

The procedure of Examples 1 and 4 are repeated, substituting for the electroless copper plating solution, an electroless nickel solution:

EXAMPLE 20

| | |
|---|---|
| nickel chloride | 30 g. |
| sodium hypophosphite | 10 g. |
| glycollic acid | 25 g. |
| sodium hydroxide | 12.5 g. |
| water (to make) | 1000 ml. |

The pH is adjusted to 4.5 and the bath temperature is maintained at 95°C. A nickel layer is built up on the copper image.

The procedures of Examples 1 and 4 are repeated, substituting for the electroless copper solution, an electroless cobalt solution:

EXAMPLE 21

| | |
|---|---|
| cobalt chloride | 30 g. |
| sodium hypophosphite | 20 g. |
| sodium citrate dihydrate | 29 g. |
| ammonium chloride | 50 g. |
| water (to make) | 1000 ml. |

The pH is adjusted to 9.5 and the bath temperature is maintained at 90°C. A cobalt layer is built up on the copper image.

The procedures of Examples 1 and 4 are repeated, substituting for the electroless copper solution, an electroless gold solution:

EXAMPLE 22

| | |
|---|---|
| gold chloride hydrochloride trihydrate | 0.01 mole/l. |
| sodium potassium tartrate | 0.014 mole/l. |
| dimethylamine borane | 0.013 mole/l. |
| sodium cyanide | 0.4 g./l. |
| water | q.s.a.d. |

The pH is adjusted to 13 and the bath temperature is maintained at 60°C. A gold layer is built up on the copper image.

The procedures of Examples 1 and 4 are repeated, substituting for the electroless copper solution, an electroless silver solution:

EXAMPLE 23

| | |
|---|---|
| silver nitrate | 1.7 g. |
| sodium potassium tartrate | 4.0 g. |
| sodium cyanide | 1.8 g. |
| dimethyl amine borane | 0.8 g. |
| water (to make) | 1000 ml. |

The pH is adjusted to 13 and the bath temperature is maintained at 80°C. A silver layer is built up on the copper image.

All such images having a layer of electroless metal on top can further be built up with an electroplated layer of copper, silver, gold, nickel, cobalt, tin, rhodium and alloys thereof, using the baths and conditions described hereinabove.

The above disclosure demonstrates that the present process provides for the selective reduction of a metal salt to metallic nuclei by means of radiant energy. The formation of a real image of a printed circuit or other type of pattern formation has been demonstrated by selectively exposing the dry coating of the metal salt to radiant energy, through a negative in the presence of a light sensitive compound and a reducing agent. The positive, visible image has been shown to be catalytic to electroless metal deposition and this metal can be used to build up conductor thickness for increased current carrying capacity or to increase the thickness of the pattern. In contrast to prior art techniques, the metallic image produced by this process requires no development steps.

It has been demonstrated that if the metal salt is reduced to its metallic state in the holes of a printed circuit substrate board, simultaneously with the circuit pattern being printed on the surface of the base material, the hole walls will be rendered catalytic to electroless metal deposition and there will be formed continuous electrically interconnecting pathways for circuitry on both sides of the base materials.

It is also possible to make interconnections, in addition to through the holes, such as interconnecting pathways around the edges of the boards and through slots made in the base material. A unique advantage of the present process is that only the portion of the hole which is exposed to activation is sensitized and becomes catalytic. If, for example, a negative of a conductor line passes over a hole or a slot, a positive slightly enlarged, catalyzed image will form on opposite sides of the hole walls. This permits electroless metal deposition to take place only on the exposed areas in the holes. It is possible in this way, with shading or masking, for example, to make multiple connections through the same hole, thereby reducing the number of holes required to make interconnections of individual conductors from outside surfaces of the circuit boards.

The invention in its broader aspects is not limited by the specific steps, methods, compositions and improvements shown and described herein, and departures may be made within the scope of the accompanying claims without departing from the principles thereof.

We claim:

1. A process for making printed circuit boards comprising treating an insulating base with a solution of a reducible non-noble metal salt, a radiation sensitive reducing compound and a secondary reducer, exposing the treated base to radiant energy in selected areas to produce free metallic nuclei in the form of a non-conducting real image of the desired circuit pattern, rinsing the exposed base to remove unexposed metal salts, and exposing the real image to an electroless metal bath to build up conductor lines of electroless metal thereon.

2. A process as defined in claim 1 wherein the radiant energy comprises light, X-ray radiation or electron beams.

3. A process as defined in claim 1 wherein said insulating base is opaque to the transmission of radiant energy therethrough.

4. A process as defined in claim 1 which also includes the intermediate step of intensifying the real image by deposition of a layer of electroless metal from an initial electroless metal bath, prior to the step of electrolessly plating the conductor lines.

5. A process as defined in claim 1 wherein said secondary reducer is an organic hydroxy compound selected from an alcohol or a polyol.

6. A process as defined in claim 5 wherein said organic hydroxy compound is glycerol, sorbitol or pentaerythritol, or a mixture of any of the foregoing.

7. A process as defined in claim 1 wherein radiation sensitive reducing compound is a visible or ultraviolet light sensitive compound.

8. A process as defined in claim 7 wherein said insulating base includes a visible or ultraviolet radiant energy absorbing barrier in an amount sufficient to render it opaque to the transmission of such energy.

9. A process as defined in claim 1 wherein said composition also includes a surfactant.

10. A process as defined in claim 9 wherein said surfactant is a non-ionic surfactant.

11. A process as defined in claim 1 wherein said composition also includes a metal reduction accelerator.

12. A process as defined in claim 11 wherein said metal reduction accelerator comprises a halogen compound, an organic acid or a mixture thereof.

13. A process as defined in claim 1 wherein the electroless metal is copper, nickel, cobalt, gold or silver.

14. A process for making printed circuit boards comprising treating an insulating base with a solution of a reducible non-noble metal salt, a radiation sensitive reducing compound and a secondary reducer, exposing the treated base to radiant energy in selected areas to radiant energy in selected areas to produce free metallic nuclei in the form of a non-conducting real image of the desired circuit pattern, rinsing the exposed base to remove unexposed metal salts, exposing the real image to an electroless metal bath to build up conductor lines of electroless metal thereon said process including the subsequent step of solder coating the circuit pattern.

15. A process for making printed circuit boards comprising treating an insulating base with a solution of a reducible non-noble metal salt, a radiation sensitive reducing compound and a secondary reducer, exposing the treated base to radiant energy in selected areas to produce free metallic nuclei in the form of a non-conducting real image of the desired circuit pattern, rinsing the exposed base to remove unexposed metal salts, exposing the real image to an electroless metal bath to build up conductor lines of electroless metal thereon said process including the step of providing the insulating base in areas on which electroless metal deposition is not desired with a poison capable of lowering the catalytic activity in the vicinity of surface imperfections which are present in said areas.

16. A process as defined in claim 15 wherein the poison comprises an element selected from the group consisting of sulfur, tellurium, selenium, polonium, arsenic or a mixture of the foregoing.

17. A process as defined in claim 15 wherein said poison is 2-mercaptobenzothiazole or nickel dibutyldithiocarbamate.

18. A process for making printed circuit boards comprising treating an insulating base with a solution of a reducible non-noble metal salt, a radiation sensitive reducing compound and a secondary reducer, exposing the treated base to radiant energy in selected areas to produce free metallic nuclei in the form of a non-conducting real image of the desired circuit pattern, rinsing the exposed base to remove unexposed metal salts, exposing the real image to an electroless metal bath to build up conductor lines of electroless metal thereon, said process including the subsequent step of depositing electroplated metal on the electroless metal.

19. A process as defined in claim 18 wherein the electroplated metal is copper, nickel, cobalt, gold or silver.

20. In a process for making printed circuit boards, the steps comprising:
   a. treating a base material having a non-polar surface with a pre-activating compound or composition;
   b. treating the pre-activated base material with an oxidizing agent;
   c. treating the pre-activated, oxidized base material with a reducing agent;
   d. treating the base to remove the pre-activating agent and excess oxidizing and reducing agents;
   e. treating the base with a poison to retard extraneous electroless metal deposition;
   f. drying the base;
   g. treating the base with a solution of a reducible non-noble metal salt, a radiation sensitive reducing compound and a secondary reducer;
   h. drying the base;
   i. exposing the base to radiant energy in selected areas to produce free metallic nuclei in the form of a non-conducting real image of the desired circuit pattern;
   j. rinsing the base to remove unexposed metal salts;
   k. immersing the base in an initial electroless metal bath to intensify the real image;
   l. electrolessly plating the intensified image to form conductor lines of the desired thickness on the base;
   m. rinsing the base; and
   n. post-curing the base to produce the printed circuit board.

21. A process as defined in claim 20 wherein the base material is opaque to the transmission of radiant energy therethrough.

22. A process as defined in claim 21 wherein the circuit pattern is formed on both major surfaces of the base.

23. A process as defined in claim 20 including the steps of producing at least one hole in the base or a pathway around the edge or through a slot before the pre-activating step (a), and also exposing the lateral walls of said hole or holes or said pathway around said edge or said slot to radiant energy during step (i) to provide after step (k) a conductive layer of metal on the hole walls or on the pathway around said edge or said slot in the printed circuit board.

24. A process as defined in claim 20 including the subsequent steps of solder coating to produce a printed circuit board having a layer of solder on the conductor lines.

25. A process as defined in claim 23 including the subsequent steps of solder coating to produce a printed circuit board having a continuous layer of solder on the conductor lines and on the layer of metal in the hole walls in the printed circuit board.

26. In a process for making printed circuit boards, the steps comprising:
   a. providing an insulating base with a resinous oxidizable surface;
   b. treating the base with an oxidizing agent to oxidize the surface and produce a microporous surface;
   c. treating the base having a microporous surface to remove excess oxidizing agent;
   d. treating the base with a poison to retard extraneous electroless metal deposition;
   e. drying the base;

f. treating the base with a solution of a reducible non-noble metal salt, a radiation sensitive reducing compound and a secondary reducer;

g. drying the base;

h. exposing the base to radiant energy in selected areas to produce free metallic nuclei in the form of a non-conducting real image of the desired circuit pattern;

i. rinsing the base to remove unexposed metal salts;

j. immersing the base in an initial electroless metal bath to intensify the real image;

k. electrolessly plating the intensified image to form conductor lines of the desired thickness on the base; and l. rinsing the base to produce the printed circuit board.

27. A process as defined in claim 26 wherein the resinous layer is an adhesive layer containing dispersed oxidizable rubber particles.

28. A process as defined in claim 26 wherein the base material is opaque to the transmission of radiant energy therethrough.

29. A process as defined in claim 28 wherein the circuit pattern is formed on both major surfaces of the base.

30. A process as defined in claim 26 including the steps of producing at least one hole in the base or a pathway around the edge of the base or through a slot before the oxidation step (b), and also exposing the lateral walls of said hole or holes or said pathway around said edge or said slot to radiant energy during step (h) to provide after step (j) a conductive layer of metal on the hole walls or on the pathway around said edge or said slot in the printed circuit boards.

31. A process as defined in claim 26 including the subsequent step of solder coating to produce a printed circuit board having a layer of solder on the conductor lines.

32. A process as defined in claim 30 including the subsequent step of solder coating to produce a printed circuit board having a continuous layer of solder on the conductor lines and on the layer of metal in the hole walls in the printed circuit board.

33. In a process for making printed circuit boards, the steps comprising:

a. providing an insulating base material having a resinous oxidizable surface;

b. treating the base with an oxidizing agent to oxidize the surface and produce a microporous surface;

c. treating the base having a microporous surface to remove excess oxidizing agent;

d. treating the base with a poison to retard extraneous electroless metal deposition;

e. drying the base;

f. treating the base with a solution of a reducible non-noble metal salt, a radiation sensitive reducing compound and a secondary reducer;

g. drying the base;

h. exposing the base to radiant energy in selected areas to produce free metallic nuclei in the form of a non-conducting real image of the desired circuit pattern;

i. rinsing the base to remove unexposed metal salts;

j. immersing the base in an initial electroless metal bath to intensify the real image; and k. electroplating the intensified image to form conductor lines of the desired thickness on the base to produce the printed circuit board.

34. A process as defined in claim 33 wherein the resinous surface is an adhesive containing dispersed oxidizable rubber particles.

35. A process as defined in claim 33 wherein the base material is opaque to the transmission of radiant energy therethrough.

36. A process as defined in claim 35 wherein the circuit pattern is formed on both major surfaces of the base.

37. A process as defined in claim 33, including the steps of producing at least one hole in the base or a pathway around the edge of the base or through a slot before the oxidizer step (b), and also exposing the lateral walls of said hole or holes or said pathway around said edge or said slot to radiant energy during step (h) to provide, after step (j), a conductive layer of metal on the hole walls or on the pathway around said edge or said slot in the printed circuit board.

38. A process as defined in claim 33 including the subsequent step of solder coating to produce a printed circuit board having a layer of solder on the conductor lines.

39. A process as defined in claim 37 including the subsequent step of solder coating to produce a printed circuit board having a continuous layer of solder on the conductor lines and on the layer of metal or metals in the hole walls in the printed circuit board.

40. In a process for making printed circuit boards, the steps comprising:

a. treating an insulating base material having a non-polar surface with a pre-activating compound or composition;

b. treating the pre-activated base material with an oxidizing agent to produce a microporous wettable surface on said base;

c. treating the pre-activated, oxidized base material with a reducing agent to neutralize and remove excess oxidizing agent from said base;

d. treating the base to remove the pre-activating agent and excess oxidizing and reducing agents;

e. treating the base with a poison to retard extraneous electroless metal deposition;

f. drying the base;

g. treating the base with a solution of a reducible metal metal salt, a radiation sensitive reducing compound and a secondary reducer;

h. drying the base;

i. exposing the base to radiant energy in selected areas to produce free metallic nuclei in the form of a non-conducting real image of the desired circuit pattern;

j. rinsing the base to remove unexposed metal salts;

k. immersing the base in an initial electroless metal bath to intensify the real image; and l. electroplating the intensified image to form conductor lines of the desired thickness on the base to produce the printed circuit board.

41. A process as defined in claim 40 wherein the base material is opaque to the transmission of radiant energy therethrough.

42. A process as defined in claim 41 wherein the circuit pattern is formed on both major surfaces of the base.

43. A process as defined in claim 40 including the steps of producing at least one hole in the base or a pathway around the edge of the base or through a slot before the pre-activating step (a), and also exposing the lateral walls of said hole or holes or said pathway around said edge or said slot to radiant energy during step (i) to provide, after step (k), a conductive layer of metal on the hole walls or on the pathway around said edge or said slot in the printed circuit board.

44. A process as defined in claim 40 including the subsequent step of solder coating to produce a printed circuit board having a layer of solder on the conductor lines.

45. A process as defined in claim 43 including the subsequent step of solder coating to produce a printed circuit board having a continuous layer of solder on the conductor lines and on the layer of metal or metals in the hole walls in the printed circuit board.

46. In a process for making printed circuit boards, the steps comprising:
a. treating an insulating base material having a non-polar surface with a pre-activating compound or composition;
b. treating the pre-activated base material with an oxidizing agent to produce a microporous, wettable surface on said base;
c. treating the pre-activated, oxidized base material with a reducing agent to neutralize and remove excess oxidizing agent from said base;
d. treating the base to remove the pre-activating agent and excess oxidizing and reducing agents;
e. treating the base with a poison to retard extraneous electroless metal deposition;
f. drying the base;
g. treating the base with a solution of a reducible copper salt and a radiation sensitive anthraquinone compound;
h. drying the base;
i. exposing the base to light through a negative mask to produce a real image comprised of free copper nuclei in the form of the desired circuit pattern;
j. rinsing the base to remove unexposed copper salts;
k. immersing the base in an initial electroless copper bath to intensify the real image;
l. immersing the base in an electroless copper bath and plating the intensified image to form conductor lines of the desired thickness;
m. rinsing the base; and
n. post-curing the base to produce the printed circuit board.

47. A process as defined in claim 46 wherein said insulating base includes a visible or ultraviolet radiant energy absorbing barrier in an amount sufficient to render it opaque to the transmission of such energy.

48. A process as defined in claim 47 wherein the circuit pattern is formed on both major surfaces of the base.

49. A process as defined in claim 46 including the steps of producing at least one hole or a pathway around the edge of the base or through a slot in the base before the pre-activating step (a), and also exposing the lateral walls of said hole or holes or said pathway around said edge or said slot to radiation during step (i) to provide, after step (k), a conductive layer of copper on the hole walls or on the pathway around said edge or said slot in the printed circuit board.

50. A process as defined in claim 46 including the subsequent step of providing a metal plated layer on said conductor pattern by electroless deposition, solder coating or electroplating.

51. A process as defined in claim 49 including the subsequent step of providing a continuous metal plated layer on said conductor pattern and in the hole walls or on the pathways by electroless deposition, solder coating or electroplating.

52. A process for making printed circuit boards comprising treating an insulating base with a composition of a reducible metal salt selected from the group consisting of copper salts, nickel salts, cobalt salts, iron salts and mixtures thereof, a radiation sensitive reducing compound and a secondary reducer, exposing the treated base to radiant energy in selected areas to produce free metallic nuclei in the form of a non-conducting real image of the desired circuit pattern, rinsing the exposed base to remove unexposed metal salts, and exposing the real image to an electroless metal bath to build up conductor lines of electroless metal thereon.

53. In a process for making printed circuit boards, the steps comprising:
a. treating a base material having a non-polar surface with a pre-activating compound or composition;
b. treating the pre-activated base material with an oxidizing agent;
c. treating the pre-activated, oxidized base material with a reducing agent;
d. treating the base to remove the pre-activating agent and excess oxidizing and reducing agents;
e. drying the base;
f. treating the base with a solution of a reducible metal salt selected from copper salts, nickel salts, cobalt salts, iron salts and mixtures thereof, a radiation sensitive reducing compound and a secondary reducer;
g. drying the base;
h. exposing the base to radiant energy in selected areas to produce free metallic nuclei in the form of a non-conducting real image of the desired circuit pattern;
i. rinsing the base to remove unexposed metal salts;
j. immersing the base in an initial electroless metal bath to intensify the real image;
k. electrolessly plating the intensified image to form conductor lines of the desired thickness on the base;
l. rinsing the base; and
m. post curing the base to produce the printed circuit board.

* * * * *

UNITED STATES PATENT AND TRADEMARK OFFICE
CERTIFICATE OF CORRECTION

PATENT NO. : 3,930,963
DATED : January 6, 1976
INVENTOR(S) : Joseph Polichette and Edward J. Leech It is certified that error appears in the above–identified patent and that said Letters Patent are hereby corrected as shown below:

Column 23, claim 14, line 27, delete

"radiant energy in selected areas to".

Signed and Sealed this twenty-fifth Day of May 1976

[SEAL]

Attest:

RUTH C. MASON
Attesting Officer

C. MARSHALL DANN
Commissioner of Patents and Trademarks